United States Patent
Okuda et al.

(10) Patent No.: US 9,941,266 B2
(45) Date of Patent: Apr. 10, 2018

(54) SEMICONDUCTOR DEVICE

(71) Applicant: ROHM CO., LTD., Kyoto (JP)

(72) Inventors: Hajime Okuda, Kyoto (JP); Motoharu Haga, Kyoto (JP); Kenji Fujii, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/379,615

(22) Filed: Dec. 15, 2016

(65) Prior Publication Data

US 2017/0179108 A1    Jun. 22, 2017

(30) Foreign Application Priority Data

Dec. 16, 2015  (JP) ................... 2015-245307
Feb. 12, 2016  (JP) ................... 2016-024524
Oct. 14, 2016  (JP) ................... 2016-202761

(51) Int. Cl.
  *H01L 27/02*  (2006.01)
  *H01L 29/78*  (2006.01)
  (Continued)

(52) U.S. Cl.
  CPC ...... *H01L 27/0255* (2013.01); *H01L 23/3171* (2013.01); *H01L 23/3736* (2013.01);
  (Continued)

(58) Field of Classification Search
  CPC .......... H01L 27/0255; H01L 23/3171; H01L 23/3736; H01L 23/49811; H01L 23/49838; H01L 29/7827
  See application file for complete search history.

(56) References Cited

U.S. PATENT DOCUMENTS 6,140,678 A * 10/2000 Grabowski ......... H01L 27/0255
                                                    257/328
2005/0035398 A1* 2/2005 Williams .......... H01L 29/66734
                                                    257/329
(Continued)

FOREIGN PATENT DOCUMENTS

JP    2010-267677 A    11/2010
JP    2015-149402 A    8/2015

OTHER PUBLICATIONS

Ryu Kamibaba et al., "Next generation 650V CSTBT™ with improved SOA fabricated by an advanced thin wafer technology", Proceedings of 27th International Symposium on Power Semiconductor Devices & IC's (ISPSD), May 10-14, 2015.
(Continued)

*Primary Examiner* — Walter H Swanson
(74) *Attorney, Agent, or Firm* — Rabin & Berdo, P.C.

(57) ABSTRACT

A semiconductor device according to the present invention includes: a substrate; a plurality of trenches formed in the substrate; and a plurality of functional element forming regions arrayed along each of the trenches, including a channel forming region as a current path, wherein the plurality of functional element forming regions includes a first functional element forming region in which the area of the channel forming region per unit area is relatively small and a second functional element forming region in which the area of the channel forming region per unit area is relatively large, and the first functional element forming region is provided at a region where heat generation should be suppressed.

20 Claims, 24 Drawing Sheets

(51) Int. Cl.
*H01L 23/498* (2006.01)
*H01L 23/31* (2006.01)
*H01L 23/373* (2006.01)

(52) U.S. Cl.
CPC .. *H01L 23/49811* (2013.01); *H01L 23/49838* (2013.01); *H01L 29/7827* (2013.01)

(56) References Cited

U.S. PATENT DOCUMENTS

2015/0129893 A1\* 5/2015 Nakano ............. H01L 29/41766
257/77
2015/0311295 A1\* 10/2015 Lee ........................ H01L 29/407
257/331

OTHER PUBLICATIONS

Hong Yao Long et al., "Next generation 1200V trench CIGBT for high voltage applications", Proceedings of 27th International Symposium on Power Semiconductor Devices & IC's (ISPSD), May 10-14, 2015.

\* cited by examiner

FIG. 1
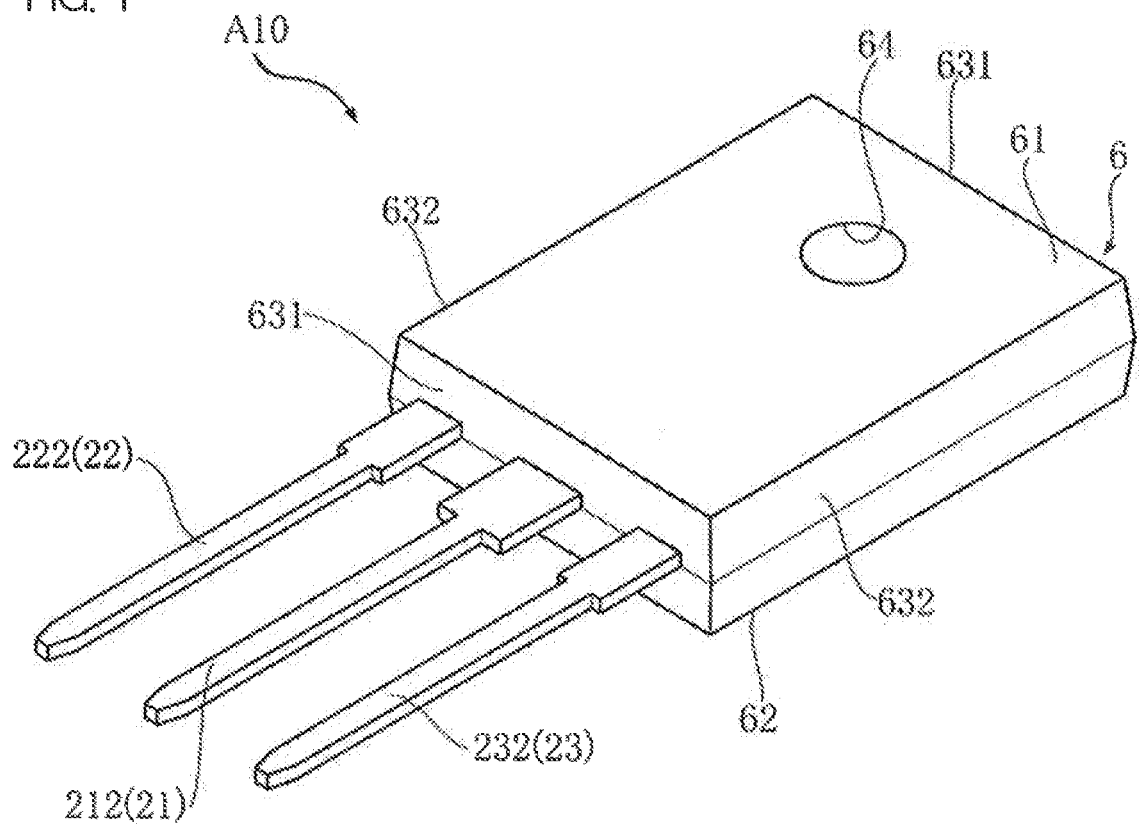
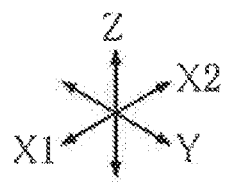

FIG. 9
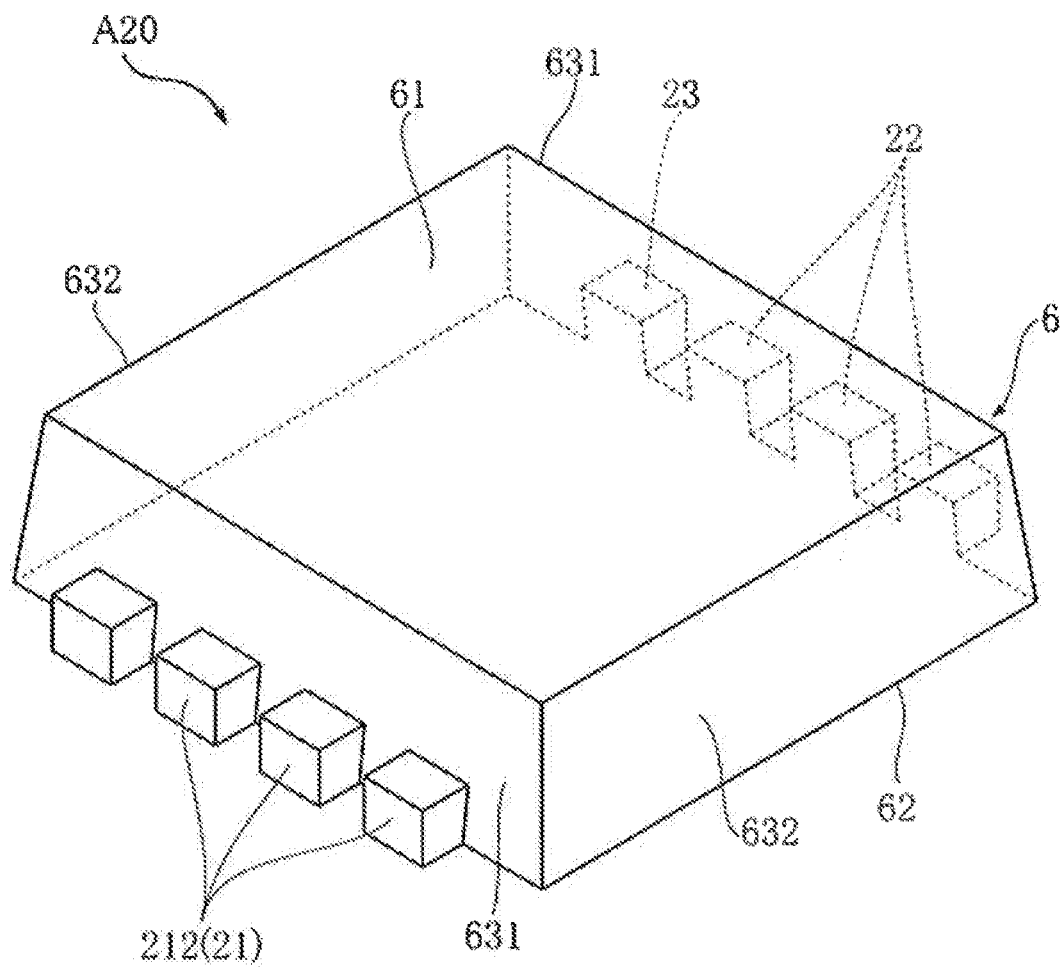
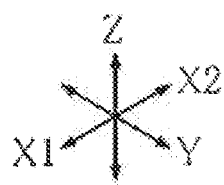

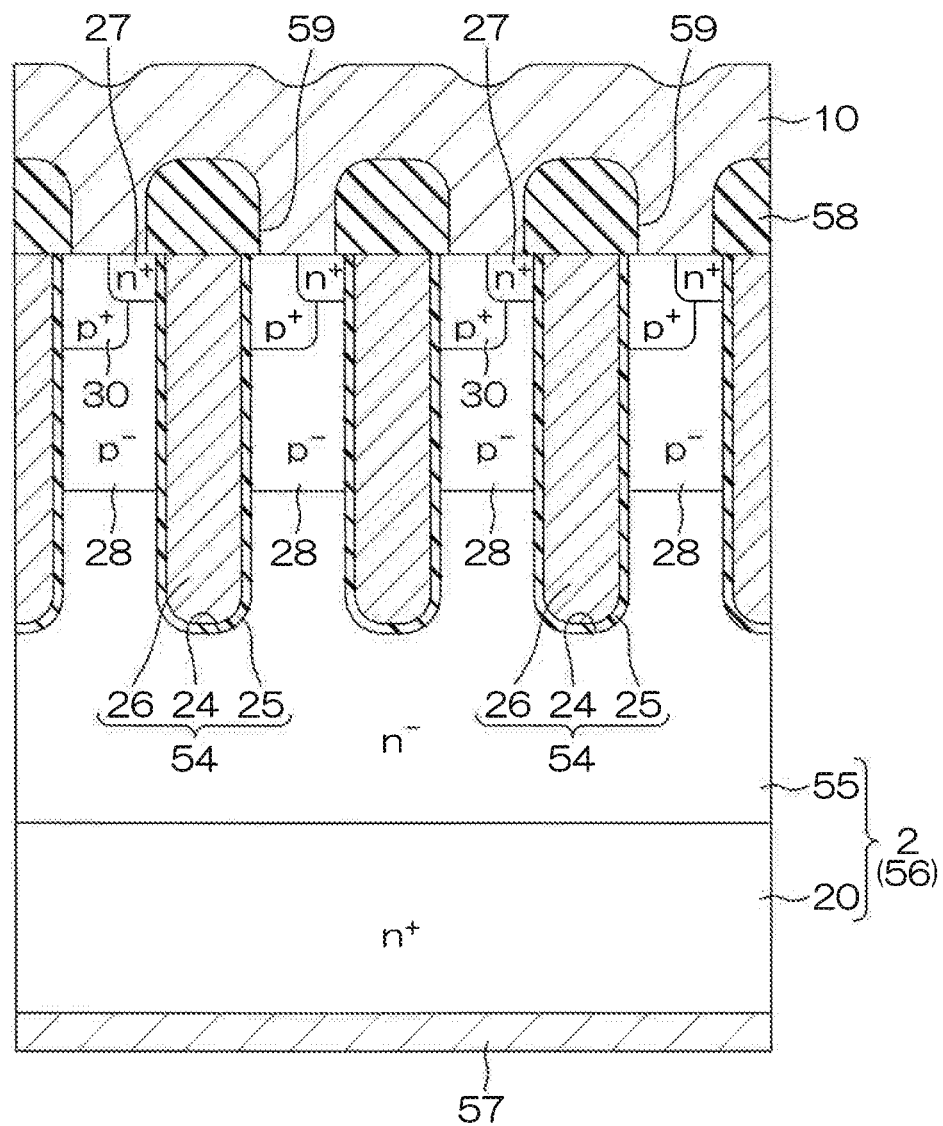

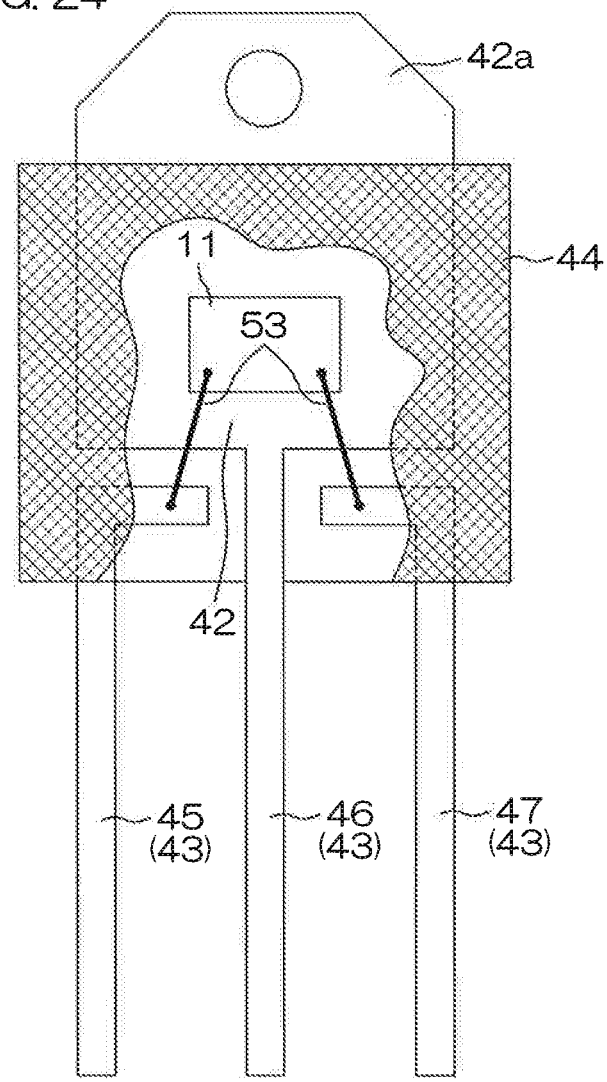

SEMICONDUCTOR DEVICE

CROSS-REFERENCE TO RELATED APPLICATIONS

This application corresponds to, Patent Application No. 2015-245307 submitted to Japanese Patent Office on Dec. 16, 2015, Patent Application No. 2016-24524 submitted to Japanese Patent Office on Feb. 12, 2016, and Patent Application No. 2016-202761 submitted to Japanese Patent Office on Oct. 14, 2016, the entire contents of these applications are hereby incorporated by reference.

TECHNICAL FIELD

The present invention relates to a semiconductor device.

BACKGROUND ART

A patent literature 1 (Japanese Unexamined Patent Application Publication 2010-267677) discloses a semiconductor device equipped with a trench gate type Metal Oxide Semiconductor Field Effect Transistor (MOSFET). The semiconductor device includes a semiconductor substrate in which a plurality of trenches is formed, a gate electrode embedded in the trenches with a gate insulating film sandwiched therebetween, and an n-type source region, a p-type body region, and n-type drift region formed in the depth direction in that order from the surface of the substrate along the lateral side of the trenches.

SUMMARY OF THE INVENTION

A semiconductor device shown in the patent literature 1 has a channel forming region as a current path formed at the entire region along both the lateral sides of each trench, and thus the semiconductor device is configured such that heat is generated in the entire region along both the lateral sides of the trenches when current flows in the channel forming region. With this configuration, the heat generated along both the lateral sides of the trenches may interact with each other at the entire region along both the lateral sides of the trenches, and therefore there is a problem that a portion of a substrate is easily subjected to high temperature transiently and locally.

Meanwhile, the semiconductor device as described in the patent literature 1 is connected to an inductive load and may be required to absorb the energy released from the inductive load when the semiconductor device is turned off. If the energy applied to the semiconductor device from the inductive load exceeds a prescribed level, the breakdown of the semiconductor may take place due to temperature rise. The energy absorption capacity for the energy stored in the inductive load is represented by dynamic clamping capability. The greater the value of the dynamic clamping capability, the more amount of energy stored in the inductive load can be absorbed.

According to the semiconductor device as shown in the patent literature 1, a portion of the substrate is possibly subjected to high temperature transiently and locally when receiving the energy from the inductive load, and thus failures might easily take place at the portion, and therefore there is a problem that the semiconductor device can no longer absorb the energy stored in the inductive load. As a result, it is difficult to achieve favorable dynamic clamping capability.

The inventors of the present application have discovered that the less temperature rise a semiconductor device is subject to, the higher dynamic clamping capability shown by the semiconductor device. Therefore, it can be considered that the dynamic clamping capability could be improved by reducing the rate of a channel forming region per unit area to thus suppress heat generation. However, in this case, there is a trade-off problem, that is, if the area of a channel forming region decreases, an on-resistance increases.

Here, the present invention primarily aims to provide a semiconductor device capable of suppressing a temperature increase by optimizing the layout of the channel forming regions.

Further, the present invention secondarily aims to provide a semiconductor device capable of increasing dynamic clamping capability while minimizing an increase in on-resistance.

The semiconductor device according to the present invention includes a substrate, a plurality of trenches formed in the substrate, and a plurality of functional element forming regions arrayed along each of the trenches, including the channel forming region as a current path. The plurality of functional element forming regions includes a first functional element forming region in which the area of the channel forming region per unit area is relatively small and a second functional element forming region in which the area of the channel forming region per unit area is relatively large. With this configuration, the first functional element forming region is provided at the region where heat generation should be suppressed.

In the semiconductor device according to the present invention, the first functional element forming region is configured such that the area of a channel forming region per unit area is relatively small compared to the area of the second functional element forming region. That is, the first functional element forming region is configured such that the amount of heat generation is relatively small, and thus the dynamic clamping capability is relatively high. As such, the first functional element forming region is provided at the region where heat generation should be suppressed, thereby favorably suppressing a temperature rise, while increasing dynamic clamping capability.

On the other hand, the second functional element forming region is configured such that the area of a channel forming region per unit area is relatively large compared to the area of the first functional element forming region. Accordingly, in the second functional element forming region, a current path having a relatively wide area can be secured with the channel forming region having a relatively large area, and therefore the current path can be prevented from decreasing as a whole in the presence of both the first functional element forming regions and the second functional element forming regions. Thereby, the increase in on-resistance can be suppressed.

As described above, according to the semiconductor device of the present invention, the temperature increase can be suppressed by optimizing the layout of the channel forming regions. Further, according to the semiconductor device of the present invention, it is possible to increase dynamic clamping capability while suppressing an increase in on-resistance.

BRIEF DESCRIPTION OF THE DRAWINGS

FIG. 1 is a perspective view of a semiconductor package according to a first embodiment of the present invention.

FIG. 9 is a perspective view of a semiconductor package according to a second embodiment of the present invention.

FIGS. 23A to 23G are vertical cross-sectional views illustrating a step of the manufacturing a power MISFET formed in the active region.

FIG. 24 is a plan view illustrating a semiconductor package in which the semiconductor device is incorporated, the semiconductor package shown partially notched.

DESCRIPTION OF EMBODIMENTS

Figure 2:
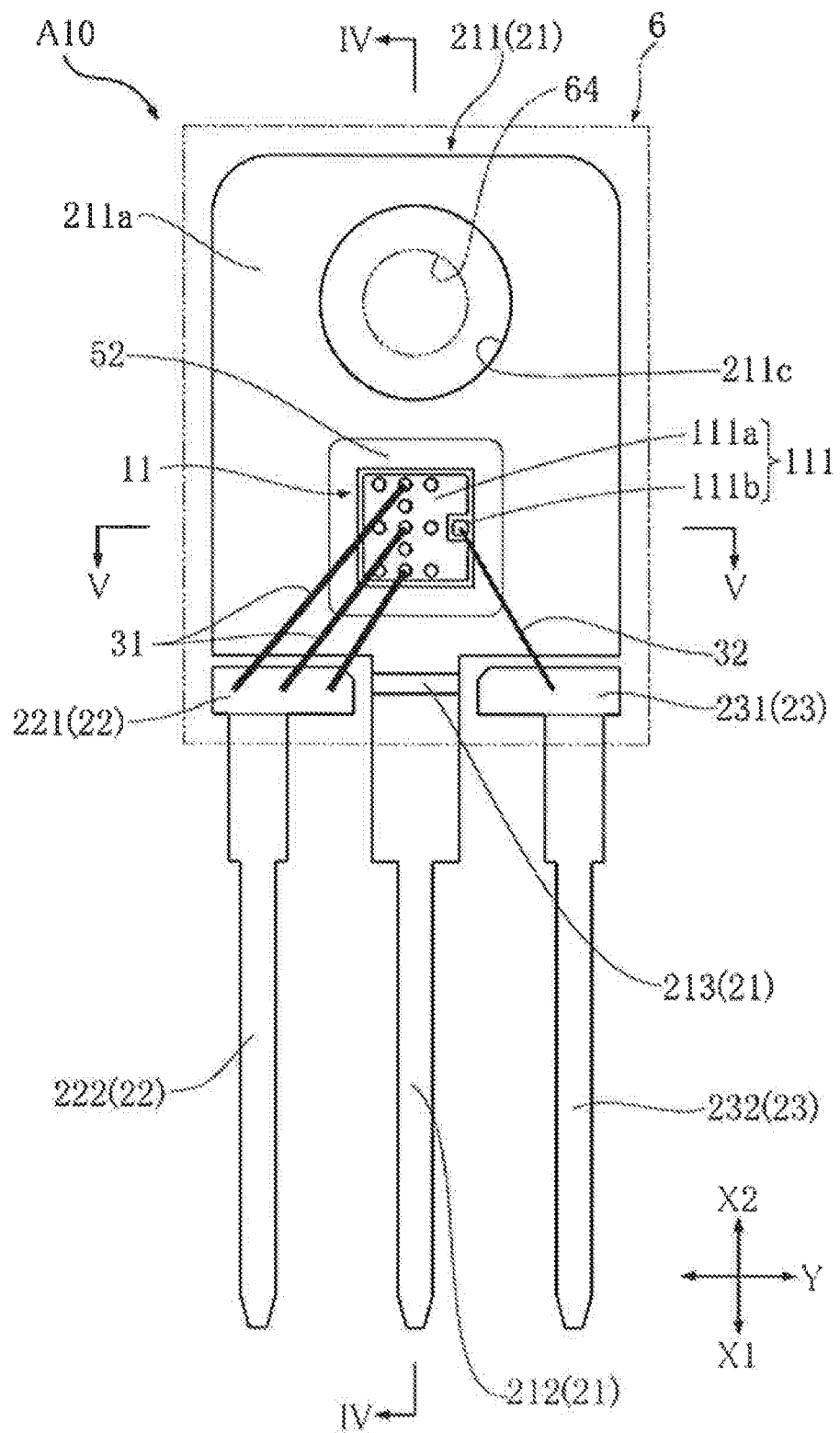
FIG. 2 is a plan view of the semiconductor package shown in FIG. 1 (sealing resin is not shown).

Hereinafter, an embodiment according to the present invention is described in detail with reference to the attached drawings.

First Embodiment

A semiconductor package A10 according to a first embodiment of the present invention is described on the basis of FIGS. 1 to 8. The semiconductor package A10 includes a semiconductor device 11, a junction layer 12, a first lead 21, a second lead 22, a third lead 23, a first bonding wire 31, a second bonding wire 32, a plurality of heat releasing member 4, an externally plated layer 51, an internally plated layer 52, and a sealing resin 6. Hereinafter, the semiconductor package A10 may be referred to as a semiconductor device A10, and the semiconductor device 11 may be referred to as a semiconductor element 11.

Figure 3:
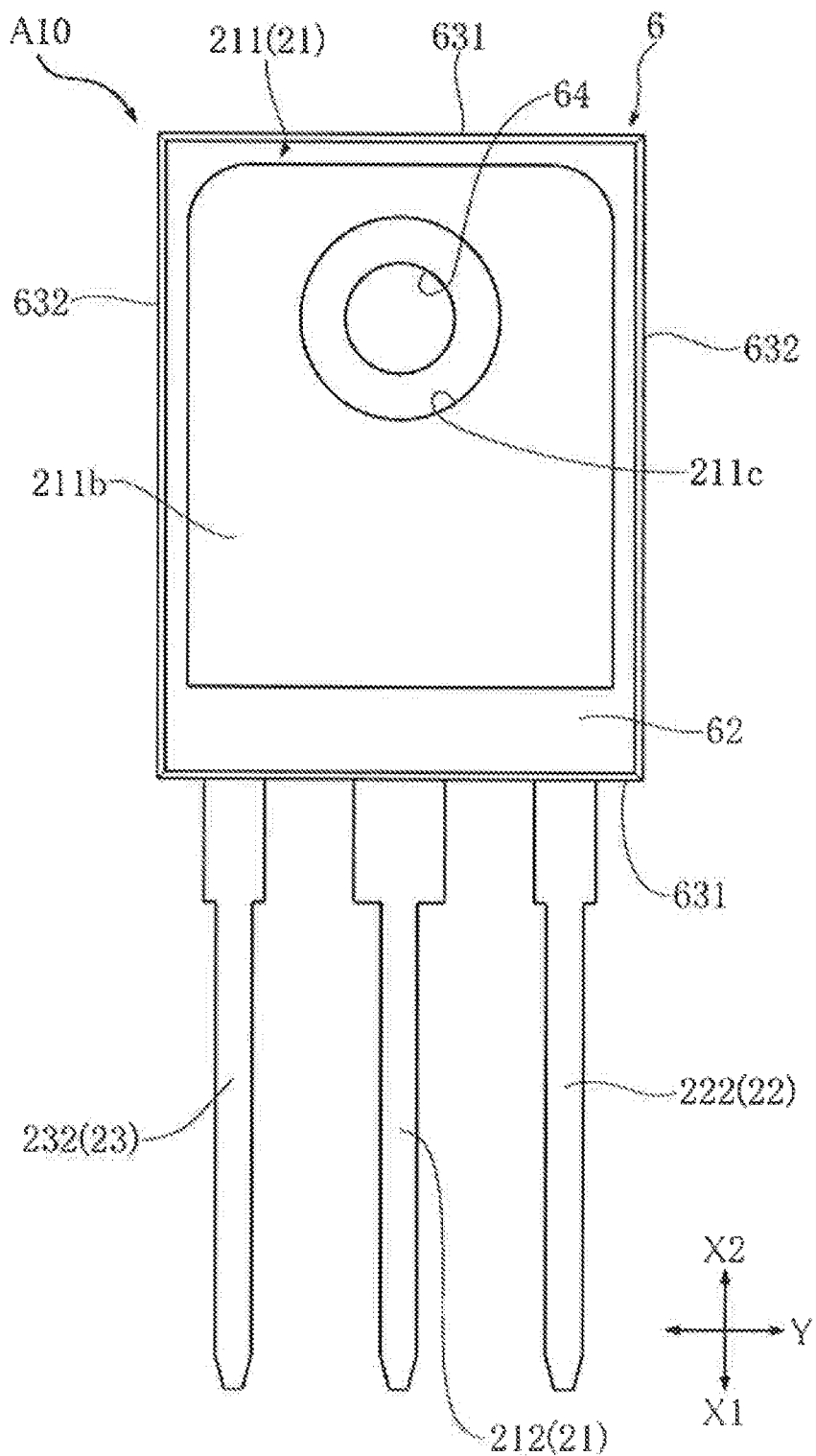
FIG. 3 is a bottom view of the semiconductor package shown in FIG. 1.
Figure 4:
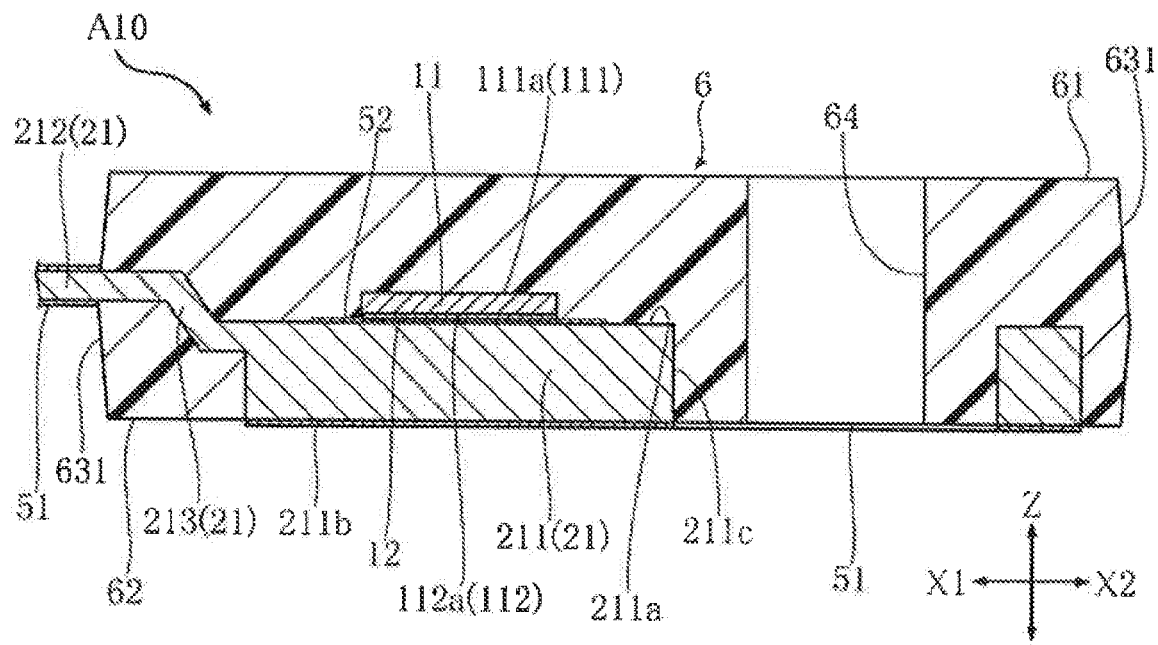
FIG. 4 is a cross-sectional view taken along the line IV-IV shown in FIG. 2.
Figure 5:
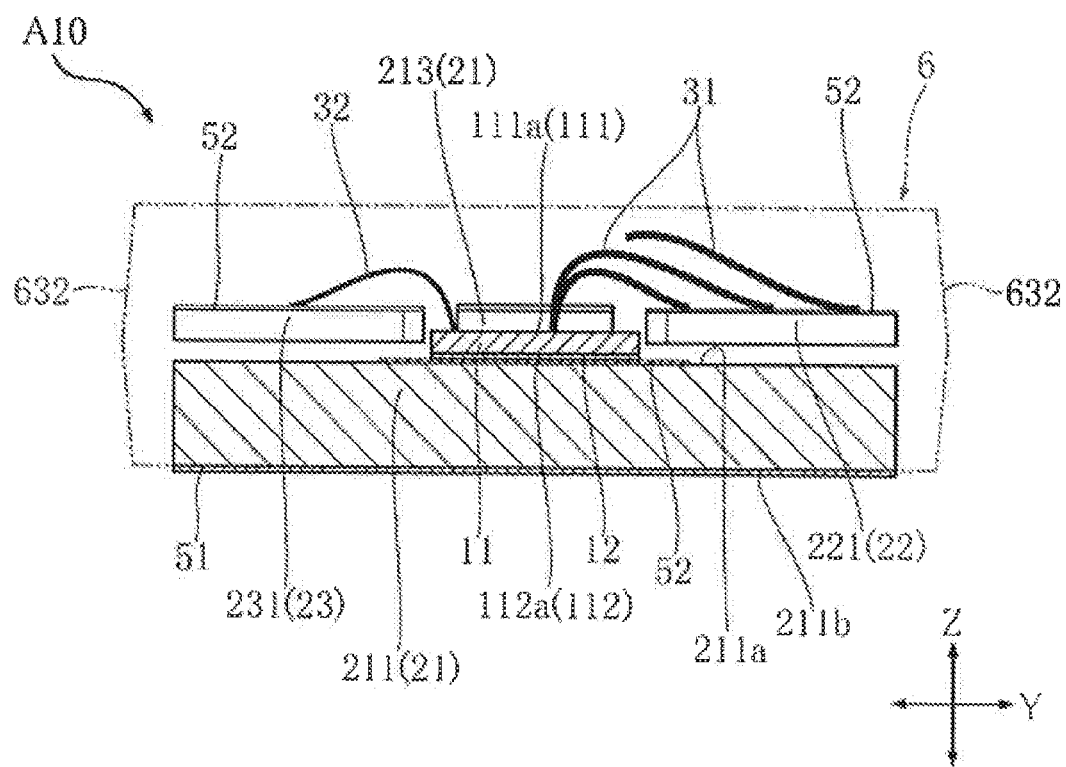
FIG. 5 is a cross-sectional view taken along the line V-V shown in FIG. 2 (sealing resin is not shown).
Figure 6:
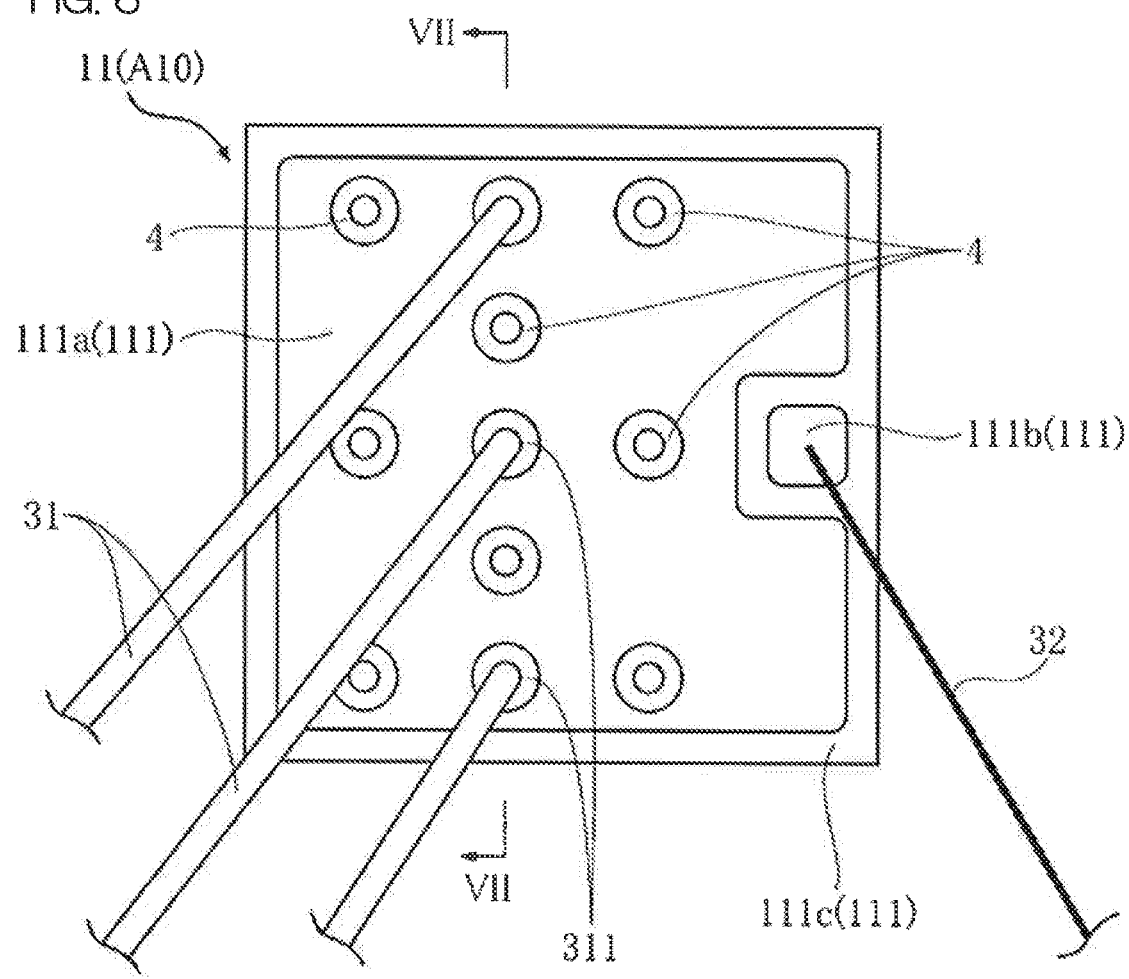
FIG. 6 is a plan view of a major part of the semiconductor device in the semiconductor package shown in FIG. 1.
Figure 7:
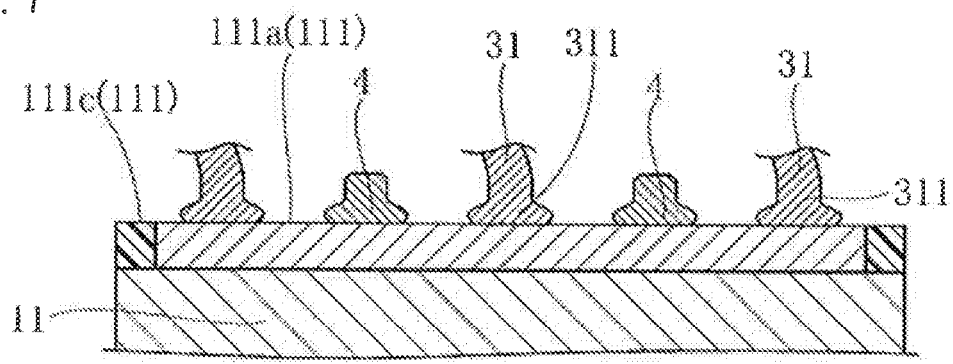
FIG. 7 is a partially cross-sectional view taken along the line VII-VII in FIG. 6.
Figure 8:
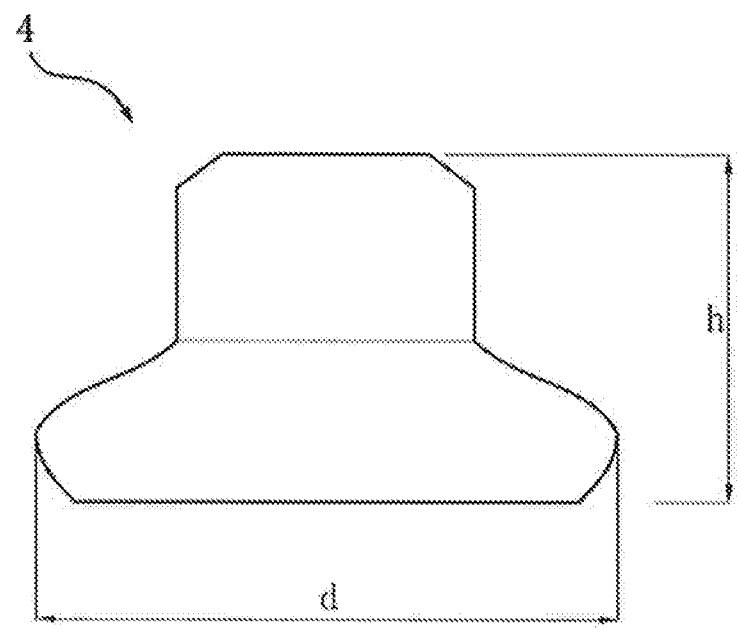
FIG. 8 is a front view of a heat releasing member of the semiconductor package shown in FIG. 1.

FIG. 1 is a perspective view of a semiconductor package A10. FIG. 2 is a plan view of the semiconductor package A10. FIG. 3 is a bottom view of the semiconductor package A10. FIG. 4 is a cross-sectional view taken along the line IV-IV shown in FIG. 2. FIG. 5 is a cross-sectional view taken along the line V-V shown in FIG. 2. FIG. 6 is a plan view of a major part of the semiconductor device 11 in the semiconductor package A10. FIG. 7 is a partially cross-sectional view taken along the line VII-VII shown in FIG. 6. FIG. 8 is a front view of a heat releasing member 4 of the semiconductor package A10. FIGS. 2 and 5 do not show the sealing resin 6 for the sake of understanding. The sealing resin 6 omitted in FIGS. 2 and 5 is shown by an imaginary line (two-dot chain line).

The semiconductor package A10 as shown in these drawings is designed to be mounted on the surface of a circuit board in an electric equipment for a vehicle. Here, for the sake of explanation, a downward direction in the plan view orthogonal to the thickness direction of the semiconductor device 11 (hereinafter, simply referred to as "thickness direction Z") is defines as a first direction X1; an upward direction opposite to the first direction X1 in the plan view is defined as a second direction X2; and the right and left direction orthogonal to the thickness direction Z, the first direction, and the second direction in the plan view is defined as a third direction Y, respectively. A portion of the semiconductor package A10 covered with the sealing resin 6 according to this embodiment is a rectangular when viewed in the thickness direction Z (hereinafter, simply referred to as "in plan view").

The semiconductor device 11 is an element for performing a central function in the semiconductor package A10. The semiconductor device 11 according to this embodiment is constituted by a power MOSFET or IGBT. The semiconductor device 11 has an element principal surface 111 and an element rear surface 112. As shown in FIGS. 4 and 5, the element principal surface 111 and the element rear surface 112 face in mutually opposite directions along the thickness direction Z.

The element principal surface 111 is the upper surface of the semiconductor device 11 shown in FIGS. 4 and 5. As shown in FIGS. 2 and 6, a second electrode 111a and a third electrode 111b are formed on the element principal surface 111. When the semiconductor device 11 is a power MOSFET, the second electrode 111a is a source electrode, and the third electrode 111b is a gate electrode. Further, when the semiconductor device 11 is an IGBT, the second electrode 111a is an emitter electrode, and the third electrode 111b is a gate electrode. The area of the second electrode 111a is larger than that of the third electrode 111b. According to this embodiment, both the second electrode 111a and the third electrode 111b are composed of a Cu layer and an Al layer mutually laminated. Further, a first bonding wire 31 is connected to the second electrode 111a, and a second bonding wire 32 is connected to the third electrode 111b. Furthermore, a plurality of heat releasing members 4 is formed in the second electrode 111a.

As shown in FIGS. 6 and 7, a passivation film 111c is formed on the element principal surface 111 according to this embodiment, which has electrical insulation properties and surrounds the periphery of the second electrode 111a and the third electrode 111b. The passivation film 111c is composed of an $Si_3N_4$ layer formed by plasma CVD method, and a polyimide layer formed by coating, that are mutually laminated.

The element rear surface 112 is the lower surface of the semiconductor device 11 shown in FIGS. 4 and 5. A first electrode 112a is formed on the entire rear surface of the element 112. When the semiconductor device 11 is a power MOSFET, the first electrode 112a is a drain electrode. Further, when the semiconductor device 11 is an IGBT, the first electrode 112a is a collector electrode.

As shown FIGS. 4 and 5, the junction layer 12 is a member having conductivity, interposed between the semiconductor device 11 and a first pad portion 211 of the first lead 21. The semiconductor device 11 is mounted on the first pad portion 211 by die bonding through the junction layer 12, and the first electrode 112a and the first lead 21 are securely conducted. The junction layer 12 is composed of a synthetic resin (so-called Ag paste) with an epoxy resin including, for example, Ag as a main material.

The first lead 21, the second lead 22, and the third lead 23 are conductive members constituting a conductive path between the semiconductor package A10 and a circuit board when being joined to the circuit board. The first lead 21, the second lead 22, and the third lead 23 are derived from the same lead frame, and the lead frame according to this embodiment is composed of a Cu-based alloy.

The first lead 21 includes the first pad portion 211, a first terminal portion 212, and an intermediate relay portion 213. As shown in FIGS. 2, 4, and 5, the first pad portion 211 has the semiconductor device 11 mounted thereon, and is electrically connected to the first electrode 112a formed on the element rear surface 112. The first pad portion 211 has a pad principal surface 211a and a pad rear surface 211b. The pad principal surface 211a is the upper surface of the first pad portion 211 as shown in FIGS. 4 and 5. The semiconductor device 11 is mounted on the pad principal surface 211a. As shown in FIG. 2, an internally plated layer 52 is formed, having a larger area than the semiconductor device 11 on the pad principal surface 211a. Therefore, as shown in FIGS. 4 and 5, the junction layer 12 is in contact with both the first electrode 112a and the internally plated layer 52. Further, the pad rear surface 211b is the lower surface of the first pad portion 211 as shown in FIGS. 4 and 5. As shown in FIG. 3, the pad rear surface 211b is exposed from the sealing resin 6 over the entire surface. As shown in FIGS. 5 and 6, the pad rear surface 211b is covered with an externally plated layer 51. The pad principal surface 211a and the pad rear surface 211b face in mutually opposite directions along the thickness direction Z, and both have a flat shape. Further, as shown in FIGS. 2 to 4, a pad through-hole 211c from the pad principal surface 211a to the pad rear surface 211b is formed spaced apart from the semiconductor device 11 in the first pad portion 211. The pad through-hole 211c has a round shape.

As shown in FIGS. 1 to 3, the first terminal portion 212 extends along the first direction X1, and is partially exposed from the sealing resin 6. As shown in FIG. 4, a portion of the first terminal portion 212 exposed from the sealing resin 6 is covered with the externally plated layer 51. The first terminal portion 212 is electrically connected to the first electrode 112a through the intermediate relay portion 213, the first pad portion 211 and the junction layer 12. As such, when the semiconductor device 11 is a power MOSFET, the first terminal portion 212 is a drain terminal of the semiconductor package A10. Further, when the semiconductor device 11 is an IGBT, the first terminal portion 212 is a collector terminal of the semiconductor package A10.

As shown in FIGS. 2 and 4, the intermediate relay portion 213 is connected to the first pad portion 211 and the first terminal portion 212. As shown in FIG. 4, the position of the first pad portion 211 is different from that of the first terminal portion 212 along the thickness direction Z, and the first pad portion 211 is arranged below the first terminal portion 212 in FIG. 4. As such, the intermediate relay portion 213 is inclined to the first pad portion 211 and the first terminal portion 212. The intermediate relay portion 213 is covered throughout with the sealing resin 6.

As shown in FIGS. 1 to 3, the second lead 22 is a member electrically connected to the second electrode 111a formed on the element principal surface 111, the second lead 22 extending along the first direction X1. The second lead 22 is arranged spaced apart from the first lead 21 and positioned to one side of the first terminal portion 212 in the third direction Y. The second lead 22 includes a second pad portion 221 and a second terminal portion 222. As shown in FIG. 2, a second pad portion 221 is longer than the second terminal portion 222 in the third direction Y and is covered throughout with the sealing resin 6. The internally plated layer 52 is formed on the upper surface of the second pad portion 221 shown in FIG. 5, and a first bonding wire 31 is connected to a portion on which the internally plated layer 52 is formed.

As shown in FIGS. 1 to 3, the second terminal portion 222 extends along the first direction X1 and a portion thereof is exposed from the sealing resin 6. The second terminal portion 222 is connected to the second pad portion 221. The portion of the second terminal portion 222 exposed from the sealing resin 6 is covered with the externally plated layer 51 as in the first terminal portion 212 shown in FIG. 4. The second terminal portion 222 is electrically connected to the second electrode 111a through the second pad portion 221 and the first bonding wire 31. As such, when the semiconductor device 11 is a power MOSFET, the second terminal portion 222 is a source terminal of the semiconductor package A10. Further, when the semiconductor device 11 is an IGBT, the second terminal portion 222 is an emitter terminal of the semiconductor package A10.

As shown in FIGS. 1 to 3, the third lead 23 is a member electrically connected to the third electrode 111b formed on the element principal surface 111, the third lead 23 extending along the first direction X1. The third lead 23 is arranged spaced apart from the first lead 21 and positioned at the opposite side of the second lead 22 across the first terminal portion 212 in the third direction Y. The third lead 23 includes a third pad portion 231 and a third terminal portion 232. As shown in FIG. 2, the third pad portion 231 is longer than the third terminal portion 232 in the third direction Y and is covered throughout with the sealing resin 6. The internally plated layer 52 is formed on the upper surface of the third pad portion 231 shown in FIG. 5, and a second bonding wire 32 is connected to a portion on which the internally plated layer 52 is formed.

As shown in FIGS. 1 to 3, the third terminal portion 232 extends along the first direction X1 and a portion thereof is exposed from the sealing resin 6. The third terminal portion 232 is connected to the third pad portion 231. The portion of the third terminal portion 232 exposed from the sealing resin 6 is covered with the externally plated layer 51 as in the first terminal portion 212 shown in FIG. 4. The third terminal portion 232 is electrically connected to the third electrode 111b through the third pad portion 231 and the second bonding wire 32. As such, when the semiconductor device 11 is a power MOSFET or an IGBT, the third terminal portion 232 is a gate terminal of the semiconductor package A10.

As shown in FIGS. 1 to 3, the first terminal portion 212, the second lead 22 and the third lead 23 are arranged along the third direction Y, and the first terminal portion 212 is positioned between the second lead 22 and the third lead 23 in the third direction Y. Further, as shown in FIGS. 1 and 4, all of the positions of the first terminal portion 212, the second lead 22 and the third lead 23 are the same in the thickness direction Z.

As shown in FIGS. 2 and 6, the first bonding wire 31 has conductivity, and connects the second electrode 111a to the second lead 22. The first bonding wire 31 according to this embodiment includes a plurality of wires, and the plurality of first bonding wires 31 connects the second electrode 111a to the second lead 22. Although three wires are arranged as the first bonding wires 31 for connecting the second electrode 111a to the second lead 22 in this embodiment, this is only an example, and the actual number of wires as the first bonding wires 31 is not limited to this number. As shown in FIGS. 6 and 7, a bonding portion 311 having a round shape in plan view is formed at the tip end of the first bonding wire 31, and the bonding portion 311 is in contact with the first electrode 112a. The bonding portion 311 is a so-called ball bonding portion that is formed by general wire bonding. The first bonding wire 31 according to this embodiment is made of Cu, and has a wire diameter of 30 to 70 μm.

The second bonding wire 32 has conductivity, and connects the third electrode 111b with the third lead 23. The shape and material of the second bonding wire 32 are not particularly limited, and, for example, may be the same as the shape and material of the first bonding wire 31.

As shown in FIGS. 6 and 7, the plurality of heat releasing members 4 is formed in the second electrode 111a spaced apart from the bonding portions 311. Each shape of the plurality of heat releasing members 4 is the same as the shape of the bonding portions 311. The heat releasing members 4 is composed of the same metal as the first bonding wire 31, and the heat releasing member 4 is composed of Cu in this embodiment. As shown in FIG. 8, the heat releasing member 4 according to this embodiment has a diameter d of 60 to 100 μm, and a thickness t (length in the thickness direction Z) of 10 to 30 μm. Further, according to this embodiment, the bonding portions 311 and the plurality of heat releasing members 4 are arranged in a grid pattern in the second electrode 111a, and the heat releasing members 4 are arranged adjacent to the bonding portions 311.

As shown in FIGS. 4 and 5, the externally plated layer 51 is formed to cover the pad rear surface 211b of the first lead 21 exposed from the sealing resin 6 and the first terminal portion 212. Further, the externally plated layer 51 is formed to cover the second terminal portion 222 of the second lead 22 and the third terminal portion 232 of the third lead 23 exposed from the sealing resin 6 as in the first terminal portion 212 of the first lead 21. The externally plated layer 51 according to this embodiment is composed of an Sn-based alloy. Specifically, a lead-free solder such as Sn—Sb based alloy or Sn—Ag based alloy is used as the alloy. The externally plated layer 51 is formed by electroplating.

As shown in FIGS. 2, 4 to 5, the internally plated layer 52 is formed on part of the pad principal surface 211a of the first lead 21 covered with the sealing resin 6, the upper surface of the second pad portion 221 shown in FIG. 5, that is part of the second lead 22, and the upper surface of the third pad portion 231 shown in FIG. 5, that is part of the third lead 23. The internally plated layer 52 according to this embodiment is made of Ag. The internally plated layer 52 is formed by electroplating.

As shown in FIGS. 1 to 3, the sealing resin 6 covers each portion of the first lead 21, the second lead 22, and the third lead 33, the semiconductor device 11, the first bonding wire 31, the second bonding wire 32, and the plurality of heat releasing members 4. The sealing resin 6 is composed of an electrically insulating thermosetting synthetic resin. The synthetic resin according to this embodiment is a black epoxy resin. The sealing resin 6 is formed is formed by, for example, transfer molding using a molding die. The sealing resin 6 has a resin principal surface 61, a resin rear surface 62, a pair of first resin lateral surfaces 631, and a pair of second resin lateral surfaces 632.

The resin principal surface 61 is the upper surface of the sealing resin 6 shown in FIG. 4. The resin rear surface 62 is the lower surface of the sealing resin 6 shown in FIG. 4. The resin principal surface 61 and the resin rear surface 62 face in mutually opposite directions along the thickness direction Z. As shown in FIGS. 3 to 5, the pad rear surface 211b that is part of the first pad portion 211 is exposed from the resin rear surface 62.

As shown in FIGS. 1 and 4, the pair of first resin lateral surfaces 631 is formed spaced apart from each other in the first direction X1 and in the second direction X2. One first resin lateral surface 631 faces toward the first direction X1 and the other first resin lateral surface 631 faces toward the second direction X2. The upper end of the first resin lateral surface 631 shown in FIG. 4 is connected to the resin principal surface 61 and the lower end of the first resin lateral surface 631 shown in FIG. 4 is connected to the resin rear surface 62. According to this embodiment, each portion of the first terminal portion 212, the second terminal portion 222 and the third terminal portion 232 is exposed from the first resin lateral surface 631 facing in the first direction X1.

As shown in FIGS. 1 and 5, the pair of second resin lateral surfaces 632 is formed spaced apart from each other in the third direction Y. The pair of second resin lateral surfaces 632 faces opposite each other in the third direction Y. The upper end of the second resin lateral surface 632 shown in FIG. 5 is connected to the resin principal surface 61 and the lower end of the second resin lateral surface 632 shown in FIG. 5 is connected to the resin rear surface 62. According to this embodiment, none of the first lead 21, the second lead 22 or the third lead 23 is exposed from the pair of second resin lateral surfaces 632.

As shown in FIGS. 1, 3 and 4, the sealing resin 6 has a body through-hole 64 from the resin principal surface 61 to the pad rear surface 211b of the first pad portion. The hole wall of the body through-hole 64 is formed of the sealing resin 6. As shown in FIGS. 2 and 3, the center of the body through-hole 64 is the same as that of the pad through-hole 211c. The diameter of the body through-hole 64 is smaller than that of the pad through-hole 211c.

Next, description is made for the effects of the semiconductor package A10. The semiconductor package A10 includes the semiconductor device 11 that has the first electrode 112a formed on the element rear surface 112 and the second electrode 111a formed on the element principal surface 111, the first lead 21 including the first pad portion 211 that has the semiconductor device 11 mounted thereon and is electrically connected to the first electrode 112a, the second lead 22 electrically connected to the second electrode 111a, and the first bonding wire 31 for connecting the second electrode 111a and the second lead 22. Further, the bonding portion 311 is formed at the tip end of the first bonding wire 31 to be in contact with the second electrode 111a, and the plurality of heat releasing members 4 is formed spaced apart from the bonding portion 311 on the second electrode 111a. For example, the semiconductor device 11 is a power MOSFET, the first electrode 112a is a drain electrode, and the second electrode 111a is a source electrode.

In this case, when the semiconductor 11 is switched on and off, a reverse voltage is applied between the first electrode 112a and the second electrode 111a through the inductance of an inductive load, and heat is generated in the second electrode 111a. At this time, the heat generated in the second electrode 111a is released to the sealing resin 6 covering the periphery of the semiconductor device 11 through the plurality of heat releasing members 4, and thus the temperature rise in the semiconductor device 11 is suppressed. As such, it is possible to avoid avalanche breakdown without changing the dimensions of the trench gate in the semiconductor device 11. As a result, the avalanche resistance of the semiconductor device 11 increases. As such, according to the semiconductor package A10, it is possible to suppress the increase in on-resistance while avoiding the complications of the circuit design of the semiconductor device 11, and increase avalanche resistance.

The shape of the heat releasing member 4 is the same as that of the bonding portion 311, and both the bonding portion 311 and the heat releasing member 4 are made of the same metal. That is, the heat releasing member 4 is created by forming only the bonding portion 311 in the general wire bonding step. Therefore, the heat releasing member 4 can be easily created at conventional manufacturing facilities.

The bonding portions 311 and the plurality of heat releasing members 4 are arranged in a grid pattern on the second electrode 111a, and thus the heat generated in the second electrode 111a can be uniformly and efficiently released.

With the plurality of first bonding wires 31 connecting the second electrode 111a and the second lead 22, the heat generated in the second electrode 111a is released also from each of the first bonding wires 31 in addition to the plurality of heat releasing members 4, and thus it is possible to further increase the avalanche resistance of the semiconductor device 11. Further, the resistance between the second electrode 111a and the second lead 22 is set to a low level, and thus it is possible to further suppress the increase in on-resistance of the semiconductor device 11.

The body through-hole 64 is formed to reach the first pad portion 211 from the resin principal surface 61 along the thickness direction Z, and the hole wall of the body through-hole 64 is made of the sealing resin 6. The sealing resin 6 is an electrically insulating synthetic resin. With this configuration, an electrically conductive fastening member such as a screw is inserted through the body through-hole 64 so that a heat releasing member such as a heat spreader can be attached to the pad rear surface 211b of the first pad portion 211. Therefore, it is possible to release the heat that is constantly generated from the first electrode 112a due to the switching of the semiconductor device 11.

The semiconductor package A10 is provided with the externally plated layer 51 that covers each portion of the first terminal portion 212, the second lead 22, and the third lead 23 that is exposed from the sealing resin 6. When the semiconductor package A10 is mounted on the surface of the circuit board by soldering, the externally plated layer 51 allows the semiconductor package A10 to be favorably soldered to each portion of the first terminal portion 212, the second lead 22 and the third lead 23, while the portion is prevented from being subject to erosion due to soldering.

Further, the semiconductor package A10 is provided with the internally plated layer 52 formed on each portion of the first pad portion 211, the second lead 22 and the third lead 23 that are covered with the sealing resin 6. When the semiconductor device 11 is mounted on the first pad portion 211, it is possible to protect the first pad portion 211, the second pad portion 221 and the third pad portion 231 by means of the internally plated layer 52 from thermal shock in association with the connection of the first bonding wire 31 to the second pad portion 221 of the second lead 22 and the connection of the second bonding wire 32 to the third pad portion 231 of the third lead 23.

Second Embodiment

Description is made for a semiconductor package A20 according to a second embodiment of the present invention with reference to FIGS. 9 to 14. In these drawings, the same reference numerals are applied to the same or similar elements as those in the semiconductor package A10 described above to thereby avoid duplicate descriptions.

Figure 10:
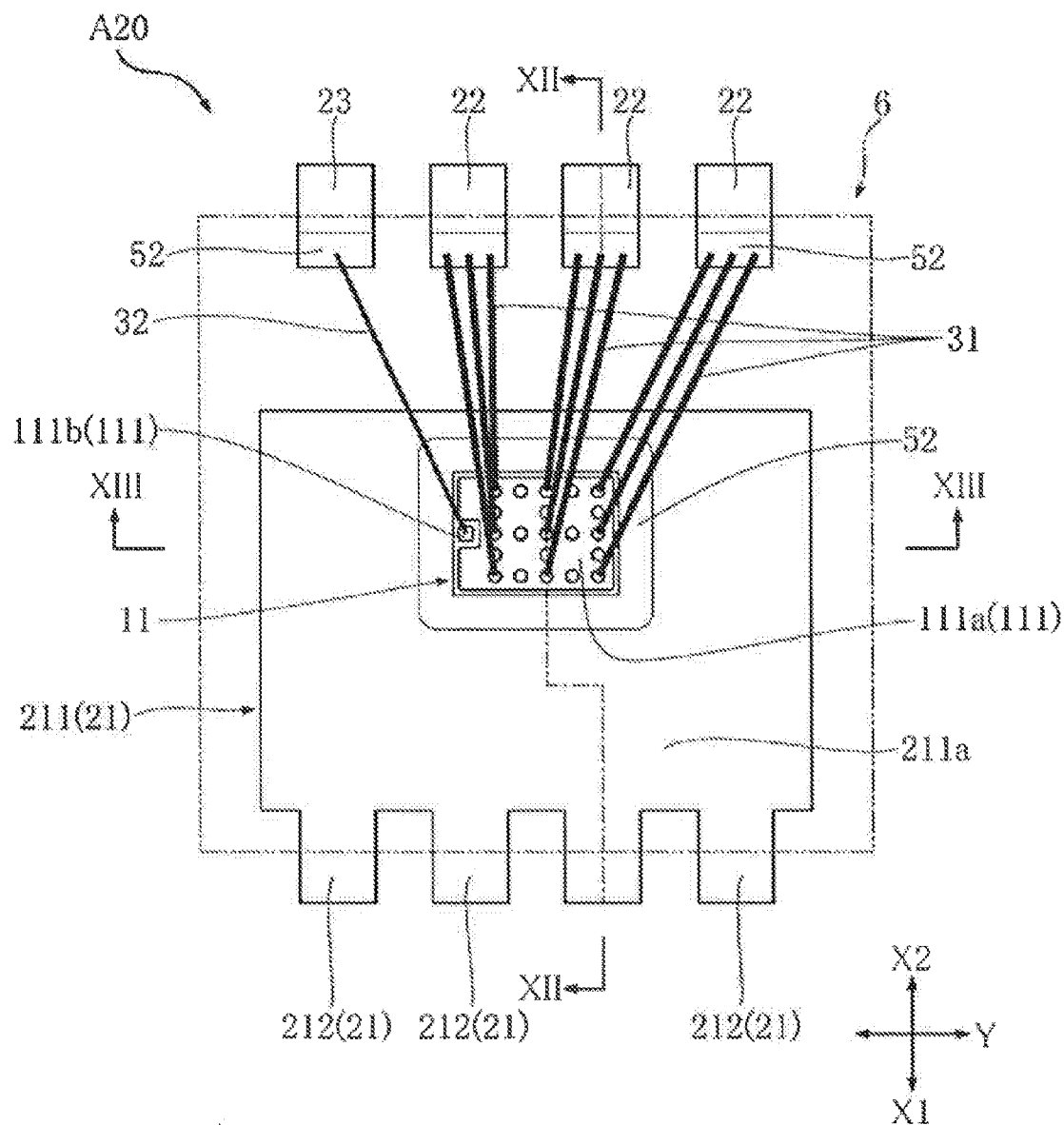
FIG. 10 is a plan view of the semiconductor package shown in FIG. 9 (sealing resin is not shown).
Figure 11:
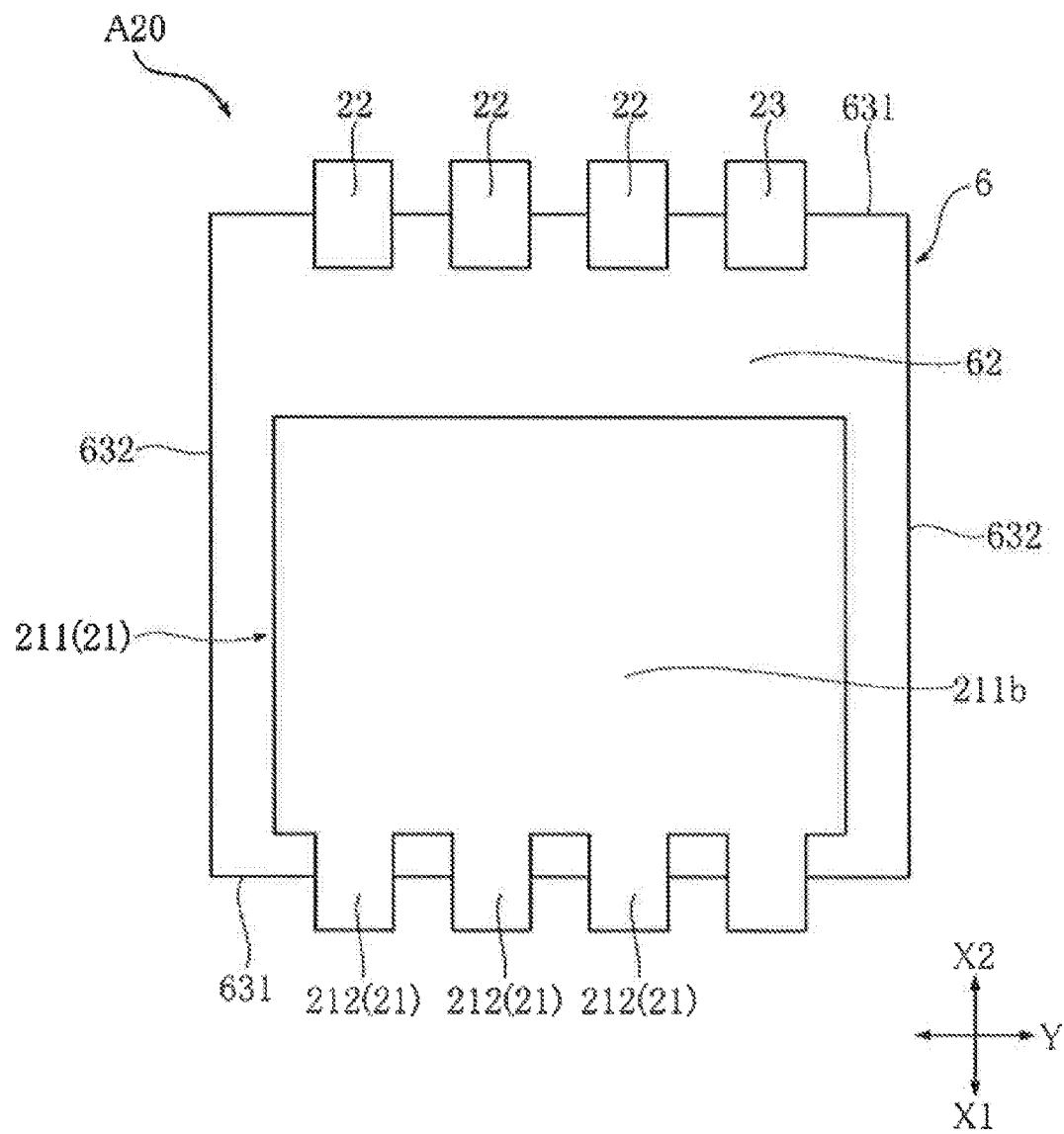
FIG. 11 is a bottom view of the semiconductor package shown in FIG. 9.
Figure 12:
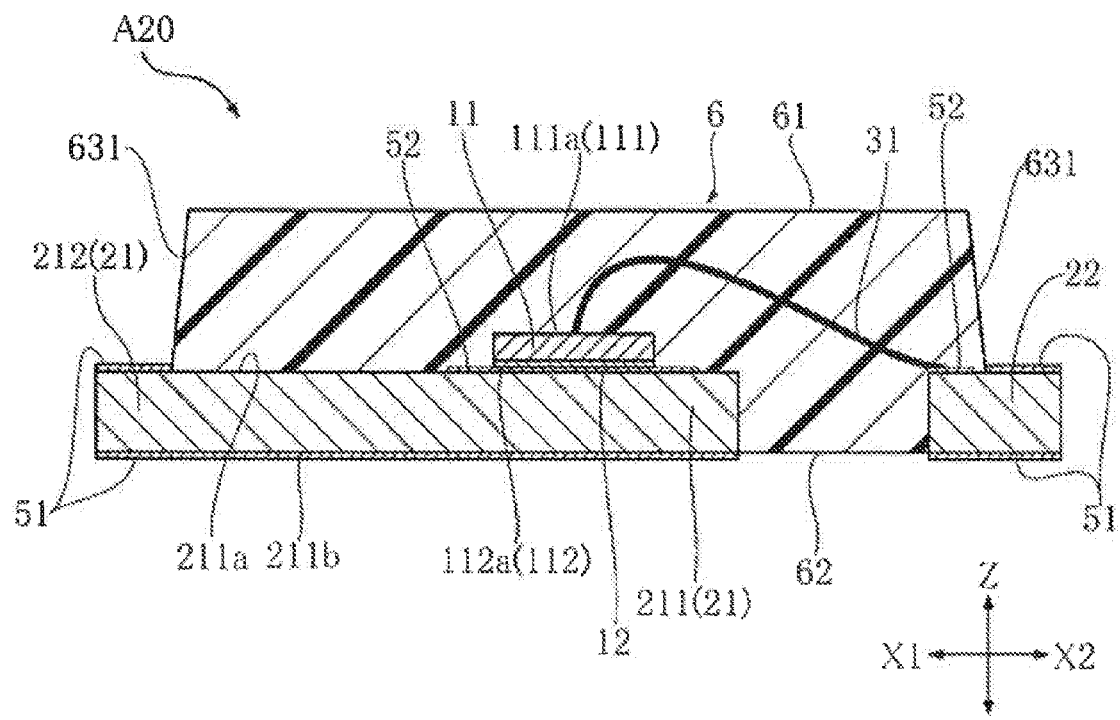
FIG. 12 is a cross-sectional view taken along the line XII-XII shown in FIG. 10.
Figure 13:
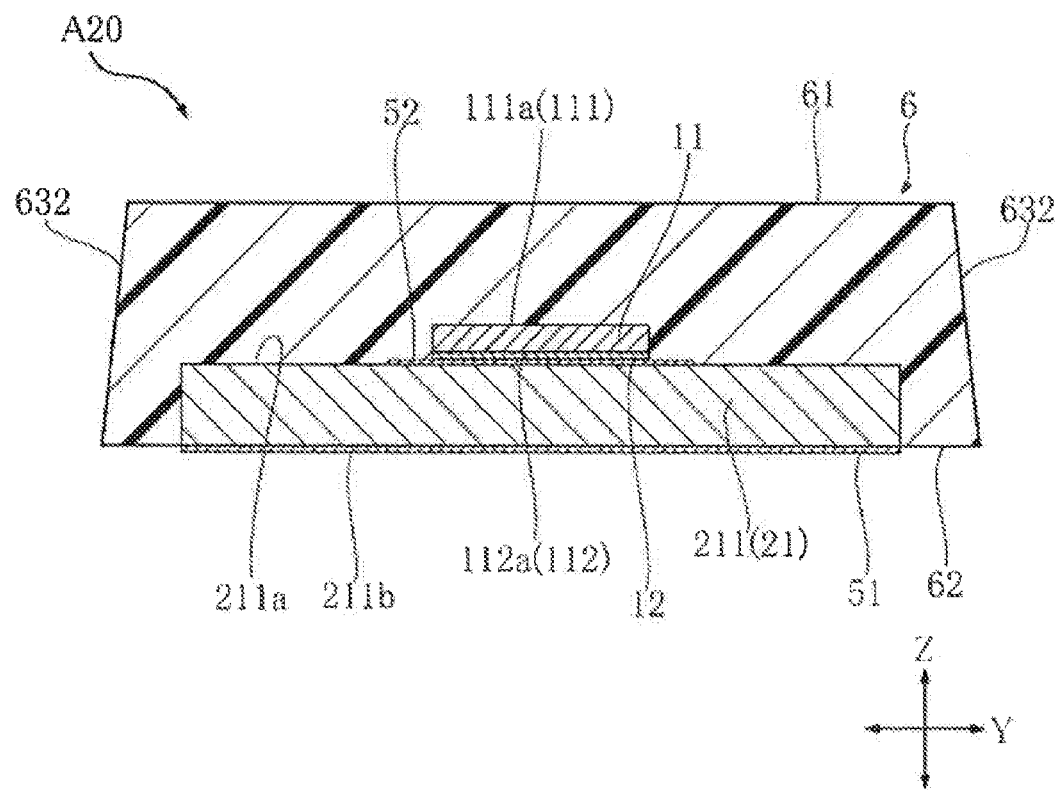
FIG. 13 is a cross-sectional view taken along the line XIII-XIII shown in FIG. 10.
Figure 14:
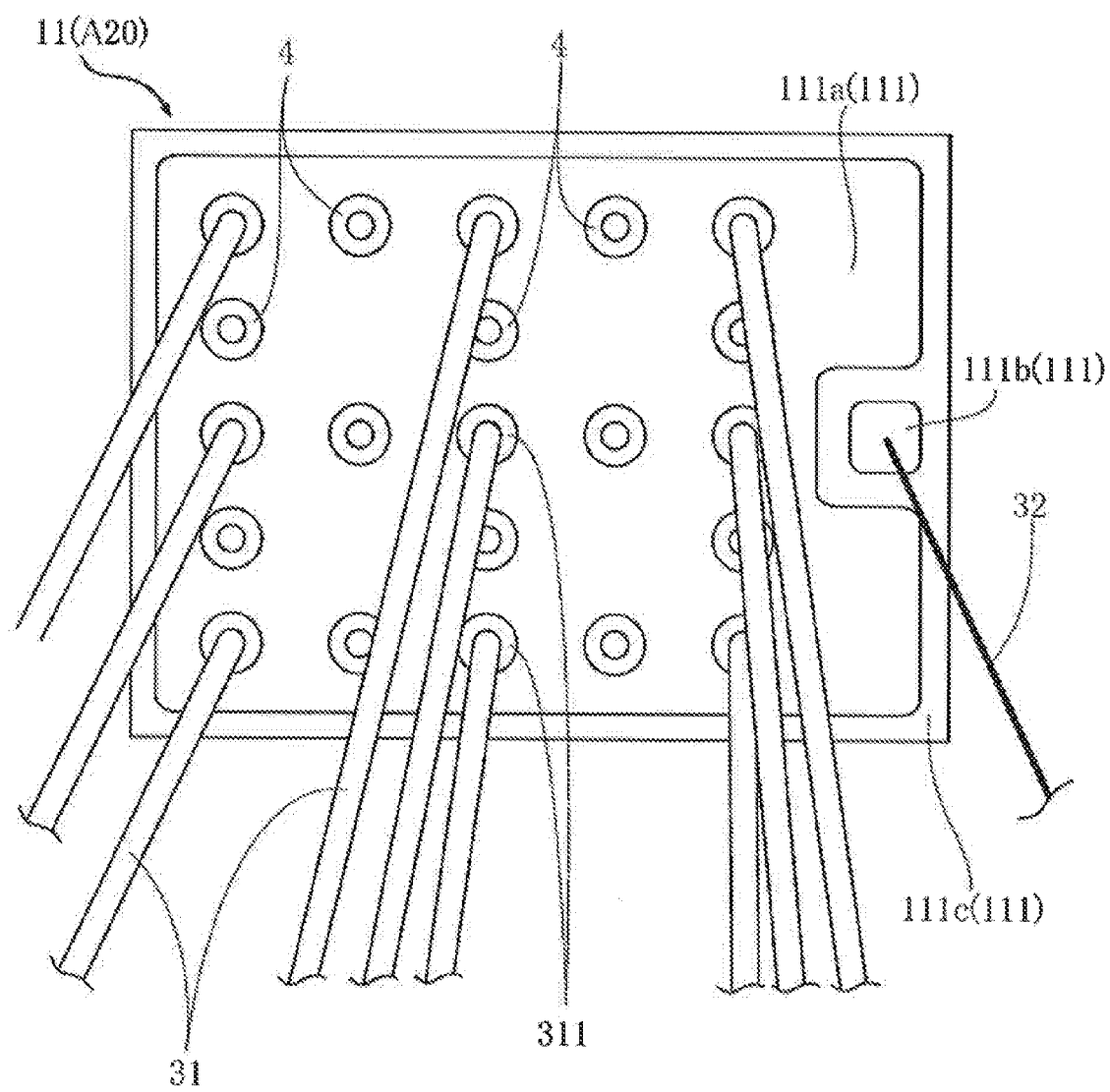
FIG. 14 is a plan view of a major part of the semiconductor device in the semiconductor package shown in FIG. 9.

FIG. 9 is a perspective view of the semiconductor package A20. FIG. 10 is a plan view of the semiconductor package A20. FIG. 11 is a bottom view of the semiconductor package A20. FIG. 12 is a cross-sectional view taken along the line XII-XII (dashed-dotted line) shown in FIG. 10. FIG. 13 is a cross-sectional view taken along the line XIII-XIII shown in FIG. 10. FIG. 14 is a plan view of a major part of the semiconductor device 11 in the semiconductor package A20. The sealing resin 6 is omitted in FIG. 10 for the sake of understanding. The sealing resin 6 omitted in FIG. 10 is shown by an imaginary line (two-dot chain line).

The semiconductor package A20 according to this embodiment is different from the above-described semiconductor package A10 in the configuration of the first lead 21, the second lead 22, the third lead 23 and the sealing resin 6, and in the arrangement of the first bonding wire 31 and the plurality of heat releasing members 4.

The first lead 21 includes the first pad portion 211 and the first terminal portion 212. As shown in FIGS. 12 and 13, the first pad portion 211 has the pad principal surface 211a and the pad rear surface 211b similarly as the semiconductor package A10. However, as shown in FIGS. 10 and 11, the pad through-hole 211c is not formed in the first pad portion 211 unlike the semiconductor package A10. As shown in FIGS. 9 to 11, the first terminal portion 212 extends along the first direction X1 with portion exposed from the sealing resin 6. A plurality of first terminal portions 212 is provided in this embodiment. Specifically, four first terminal portions 212 are provided. The length of the first terminal portions 212 according to this embodiment is shorter than that of the first terminal portion 212 of the semiconductor package A10. The lower surface of the first terminal portion 212 as shown in FIG. 12 is flush with the pad rear surface 211b.

Further as shown in FIGS. 12 and 13, the pad rear surface 211*b* exposed from the sealing resin 6 and each portion of the plurality of first terminal portions 212 are covered with the externally plated layer 51.

As shown in FIGS. 9 to 11, the second lead 22 extends along the second direction X2. In this embodiment, a plurality of the second leads 22 is provided. Specifically, three second leads 22 are provided. Each second lead 22 is electrically connected to the second electrode 111*a* formed on the element principal surface 111. The plurality of second leads 22 is arranged spaced apart from each other along the third direction Y. The length of the second lead 22 according to this embodiment is shorter than that of the second terminal portion 222 of the semiconductor package A10. The lower surface of the second lead 22 as shown in FIG. 12 is flush with the pad rear surface 211*b*. Further as shown in FIG. 12, each portion of the plurality of second leads 22 is covered with the externally plated layer 51. Further, the internally plated layer 52 is formed on the upper surface of the second lead 22 that is covered with the sealing resin 6 as shown in FIG. 12.

As shown in FIGS. 9 to 11, the third lead 23 extends along the second direction X2 similarly as the second lead 22. The third lead 23 is arranged along the third direction Y together with the plurality of second leads 22. The shape and the size of the third lead 23 according to this embodiment is the same as the second lead 22. Similarly to the second lead 22 shown in FIG. 12, a portion of the third lead 23 exposed from the sealing resin 6 is covered with an externally plated layer 51, and the internally plated layer 52 is formed on a portion covered with the sealing resin 6, to which the second bonding wire 32 is connected.

As shown in FIGS. 10 and 14, a plurality of first bonding wires 31 is provided, and the plurality of first bonding wires 31 connects the second electrode 111*a* with the second lead 22. In this embodiment, three first bonding wires 31 are provided for each first lead 22 to connect the second electrode 111*a* with the second lead 22, and thus totally nine first bonding wires 31 are provided to connect the second electrode 111*a* with the second lead 22. However, this is an example similarly to the semiconductor package A10, and the actual number of the first bonding wires 31 is not limited to this number.

The plurality of heat releasing members 4 is formed spaced apart from the bonding portion 311 on the second electrode 111*a* as in the semiconductor package A10. As shown in FIG. 14, the bonding portions 311 and the plurality of heat releasing members 4 are arranged in a grid pattern on the second electrode 111*a*. The heat releasing members 4 are arranged adjacent to the bonding portions 311.

The sealing resin 6 includes the resin principal surface 61, the resin rear surface 62, the pair of first resin lateral surfaces 631 and the pair of second resin lateral surfaces 632 as in the semiconductor package A10. However, as shown in FIGS. 9 and 11, the body through-hole 64 is not formed in the sealing resin 6 according to this embodiment unlike the semiconductor package A10. As shown in FIG. 11, in this embodiment, each portion of the pad rear surface 211*b*, the first terminal portion 212, the second lead 22, and the third lead 23 is exposed from the resin rear surface 62. Further, as shown in FIG. 9, a portion of the first terminal portion 212 is exposed from the first resin lateral surface 631 facing in the first direction X1 of the pair of the first resin lateral surfaces 631, each portion of the second lead 22 and the third lead 23 is exposed from the first resin lateral surface 631 facing in the second direction X2.

Next, description is made for the effects of the semiconductor package A20.

The semiconductor package A20, as in the semiconductor package A10, includes the semiconductor device 11 that has the first electrode 112*a* formed on the element rear surface 112 and the second electrode 111*a* formed on the element principal surface 111, the first lead 21 including the first pad portion 211 that has the semiconductor device 11 mounted thereon and is electrically connected to the first electrode 112*a*, the second lead 22 electrically connected to the second electrode 111*a*, and the first bonding wire 31 for connecting the second electrode 111*a* and the second lead 22. Further, the bonding portion 311 is formed at the tip end of the first bonding wire 31 to be in contact with the second electrode 111*a*, and the plurality of heat releasing members 4 is formed spaced apart from the bonding portion 311 on the second electrode 111*a*. As such, also according to the semiconductor package A20, it is possible to suppress the increase in on-resistance while avoiding the complications of the circuit design of the semiconductor device 11, and increase avalanche resistance.

Next, description is made for a configuration example when the above-described semiconductor device 11 is a power MISFET.

<Schematic Configuration of Semiconductor Device>

Figure 15B:
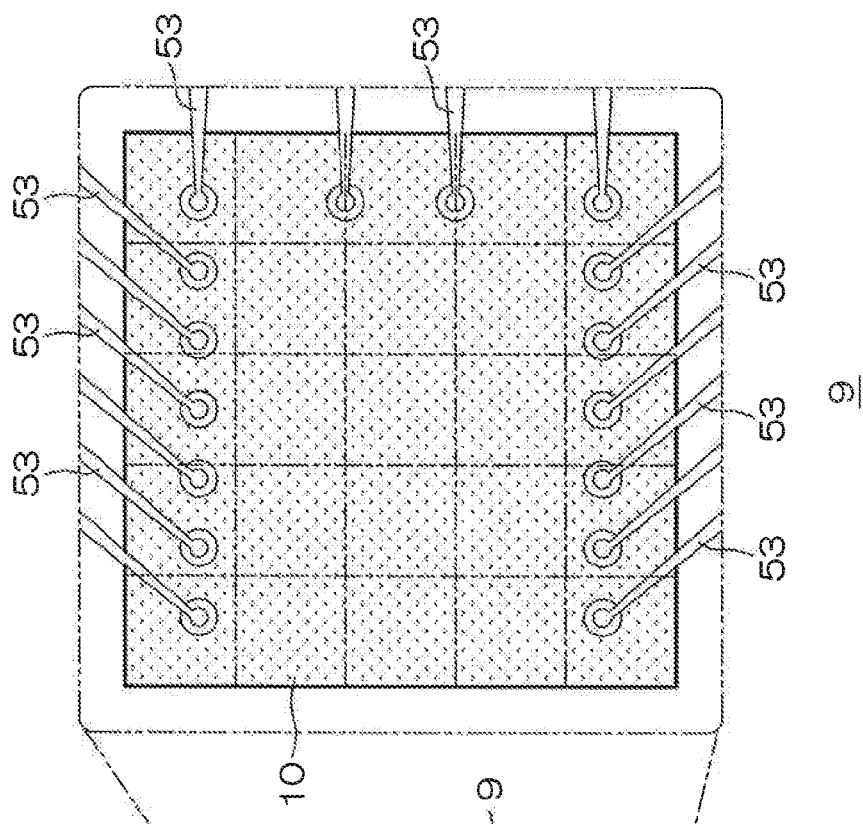
FIG. 15B is an enlarged plan view illustrating an active region.
Figure 15A:
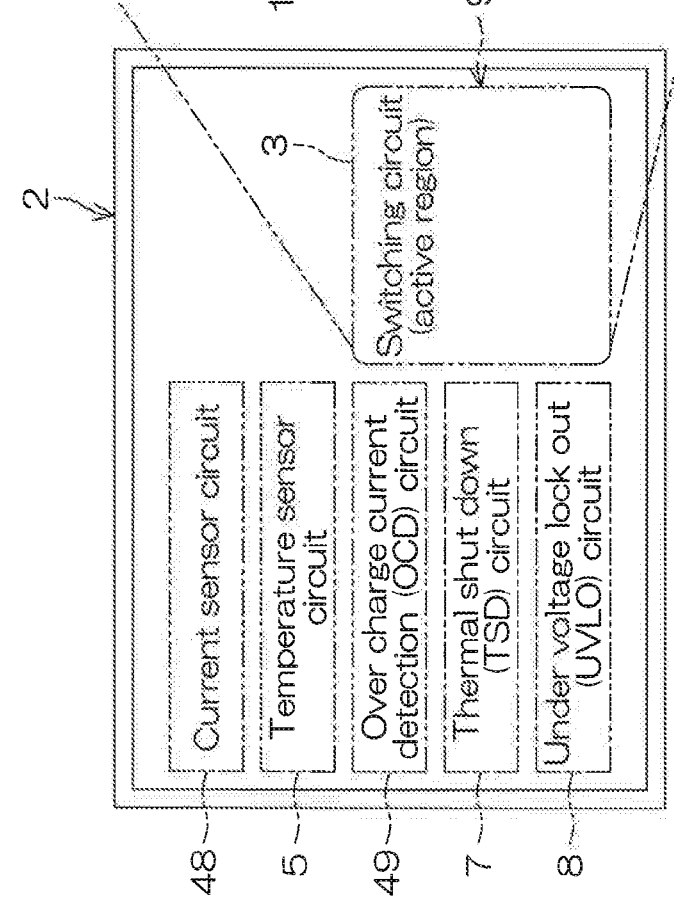
FIG. 15A is a schematic block diagram illustrating a semiconductor device according to an embodiment of the present invention.

FIG. 15A is a schematic block diagram illustrating a semiconductor device 1 according to an embodiment of the present invention. FIG. 15B is an enlarged plan view illustrating an active region 9.

With reference to FIG. 15A, the semiconductor device 1 corresponding to the above-described semiconductor device 11 includes a substrate 2 rectangularly shaped in plan view. The semiconductor device 1 includes a switching circuit 3 having a plurality of power Metal Insulator Semiconductor Field Effect Transistors (MISFETs) as an example of the functional element of the present invention formed in the surface part of the substrate 2.

The semiconductor device 1 further includes a current sensor circuit 48, a temperature sensor circuit 5, an over charge current Detection (OCD) circuit 49, a thermal shut down (TSD) circuit 7, and an under voltage lock out (UVLO) circuit 8. The current sensor circuit 48, the temperature sensor circuit 5, the overcharge current detection circuit 49, the thermal shut down circuit 7, and the under voltage lock out circuit 8 are all formed in the surface part of the substrate 2. That is, according to this embodiment, the semiconductor device 1 is an Intelligent Power Switch (IPS) in which the switching circuit 3 (power MISFET), the current sensor circuit 48, the temperature sensor circuit 5, the overcharge current detection circuit 49, the thermal shut down circuit 7, and the under voltage lockout circuit 8 are formed in the common surface part of the substrate 2.

With reference to FIG. 15B, the switching circuit 3 (power MISFET) is formed in the active region 9 provided in the substrate 2. The active region 9 is formed to have a rectangular shape in plan view in this embodiment, and is covered with a source metal 10. The source metal 10 may correspond to the above-described second electrode 111*a*. In FIG. 15B, the source metal 10 is shown in a pale dot hatch pattern. A plurality of bonding wires 53, as an example of the conductive wire according to the present invention, is selectively connected to the source metal 10. The power MISFET formed in the active region 9 is driven by power supplied from the bonding wires 53.

<Electrical Structure of Semiconductor Device>

Figure 16:
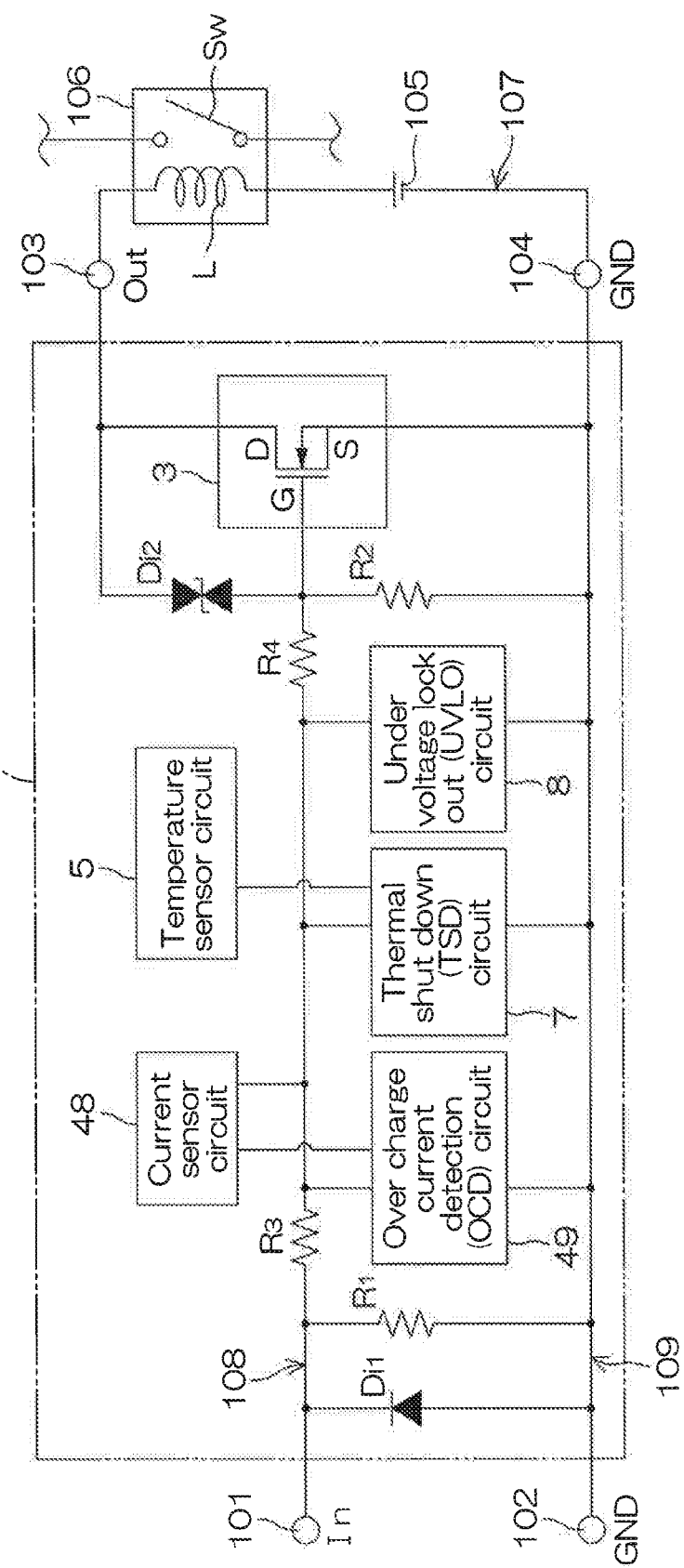
FIG. 16 is an electric circuit diagram illustrating an example of the inner electrical structure of the semiconductor device.

FIG. 16 is an electric circuit diagram illustrating an example of the inner electrical structure of the semiconductor device 1. As shown in FIG. 16, the semiconductor device 1 includes a pair of input terminal 101 and input ground terminal 102, and a pair of output terminal 103 and output ground terminal 104. FIG. 16 shows an example in which a series circuit 107 including a power source 105 and an inductive load 106 is externally connected between the output terminal 103 and the output ground terminal 104. Also, FIG. 16 shows an example in which the inductive load 106 is a relay including a switch Sw and a coil L.

The switching circuit 3 described above is connected between the output terminal 103 and the output ground terminal 104. The switching circuit 3 includes the above-described power MISFET. The power MISFET includes a gate terminal G, a drain terminal D, and a source terminal S. The switching circuit 3 is provided so that the drain terminal D of the power MISFET is connected to the output terminal 103 and the source terminal S of the power MISFET is connected to the output ground terminal 104. Although the switching circuit 3 may include a plurality of the power MISFET, only one power MISFET is shown in FIG. 16 for the sake of explanation.

An input wire 108 is connected between the input terminal 101 and the gate terminal G of the power MISFET. A ground wire 109 is connected between the input ground terminal 102 and the output ground terminal 104. A diode $Di_1$, a first resistance $R_1$, the previously described overcharge current detection circuit 49, the previously described thermal shut down circuit 7, the previously described under voltage lock out circuit 8, and a second resistance $R_2$ are connected in parallel in a ladder like arrangement between the input wire 108 and the ground wire 109 in order from the input terminal 101. A third resistance $R_3$ is connected in series with the input wire 108 between the first resistance $R_1$ and the overcharge current detection circuit 49. A fourth resistance $R_4$ is connected in series with the input wire 108 between the under voltage lock out circuit 8 and the second resistance $R_2$.

The previously described current sensor 48 is connected to the overcharge current detection circuit 49. The current sensor 48 detects currents flowing, for example, in the input wire 108. The current value detected by the current sensor 48 is supplied to the overcharge current detection circuit 49. The overcharge current detection circuit 49 is driven on the basis of the current value supplied from the current sensor 48. For example, when a current greater than a prescribed value (overcharge current) due to short circuit or static electricity flows in the input wire 108, the overcharge current detection circuit 49 flows the overcharge current from the input wire 108 to the ground wire 109, thereby protecting other circuits from the overcharge current.

The previously described temperature sensor circuit 5 is connected to the thermal shut down circuit 7. The temperature sensor circuit 5 detects the temperature of the substrate 2. The temperature detected by the temperature sensor circuit 5 is supplied to the thermal shut down circuit 7. The thermal shut down circuit 7 is driven on the basis of the temperature supplied from the temperature sensor circuit 5. For example, when the temperature of the substrate 2 becomes greater than a prescribed value, the thermal shut down circuit 7 shuts down power supply to the input wire 108, thereby suppressing the temperature rise of the substrate 2.

The under voltage lockout circuit 8 is configured to prevent the operation of the switching circuit 3 when the potential difference between the input wire 108 and the ground wire 109 is lower than a prescribed value, and allow the switching circuit 3 to operate when the potential difference is greater than or equal to the prescribed value.

A clamp diode $Di_2$ is connected between the gate terminal G and the drain terminal D in the power MISFET. The clamp diode $Di_2$ is composed of two diodes connected reverse biased. The two diodes may include a Zener diode. The clamp diode $Di_2$ has a breakdown voltage $V_2$ lower than a breakdown voltage $V_1$ between the drain terminal D and the source terminal S in the power MISFET (breakdown voltage $V_1$>breakdown voltage $V_2$). Therefore, when the breakdown voltage $V_1$ is applied between the drain terminal D and the source terminal S, the clamp diode $Di_2$ breaks down before the power MISFET.

When a counter electromotive voltage $V_L$ that is higher than the breakdown voltage $V_1$ between the drain terminal D and the source terminal S (counter electromotive voltage $V_L$>breakdown voltage $V_1$), is generated in the coil L after the inductive load 106 is turned off, the clamp diode $Di_2$ breaks down. When the clamp diode $Di_2$ breaks down, a current flows in the second resistance $R_2$, and a voltage (gate voltage) is generated between the gate terminal G and the source terminal S. The power MISFET is turned on by this gate voltage, and thus current generated due to the counter electromotive voltage $V_L$ flows between the drain terminal D and the source terminal S.

In this way, the load on the power MISFET is reduced by the clamp diode $Di_2$ while the energy stored in the inductive load 106 is absorbed by the power MISFET. How much of the energy stored in the inductive load 106 is absorbed is represented by a dynamic clamping capability $E_{ac}$ that is one of the characteristics of the power MISFET. The greater the value of the dynamic clamping capability $E_{ac}$, the more the energy stored in the inductive load 106 is absorbed.

Although the embodiment describes the current sensor circuit 48, the temperature sensor circuit 5, the overcharge current detection circuit 49, the thermal shut down circuit 7, and the under voltage lock out circuit 8, the clamp diode $Di_2$, and various types of resistances $R_1$ to $R_4$ and so forth, as an example of the circuits constituting part of the IPS, these circuits are not necessarily required for the IPS. Further the semiconductor device 1 is not limited to the IPS. Therefore, the semiconductor device 1 may be a so-called discrete component only including the switching circuit 3 (power MISFET). In this case, the current sensor circuit 48, the temperature sensor circuit 5, the overcharge current detection circuit 49, the thermal shut down circuit 7, and the under voltage lock out circuit 8, the clamp diode $Di_2$, and various types of resistances $R_1$ to $R_4$ and so forth, may be constituted by another component that is externally connected with respect to the semiconductor device 1.

<Planar Structure of Active Region>

Figure 17:
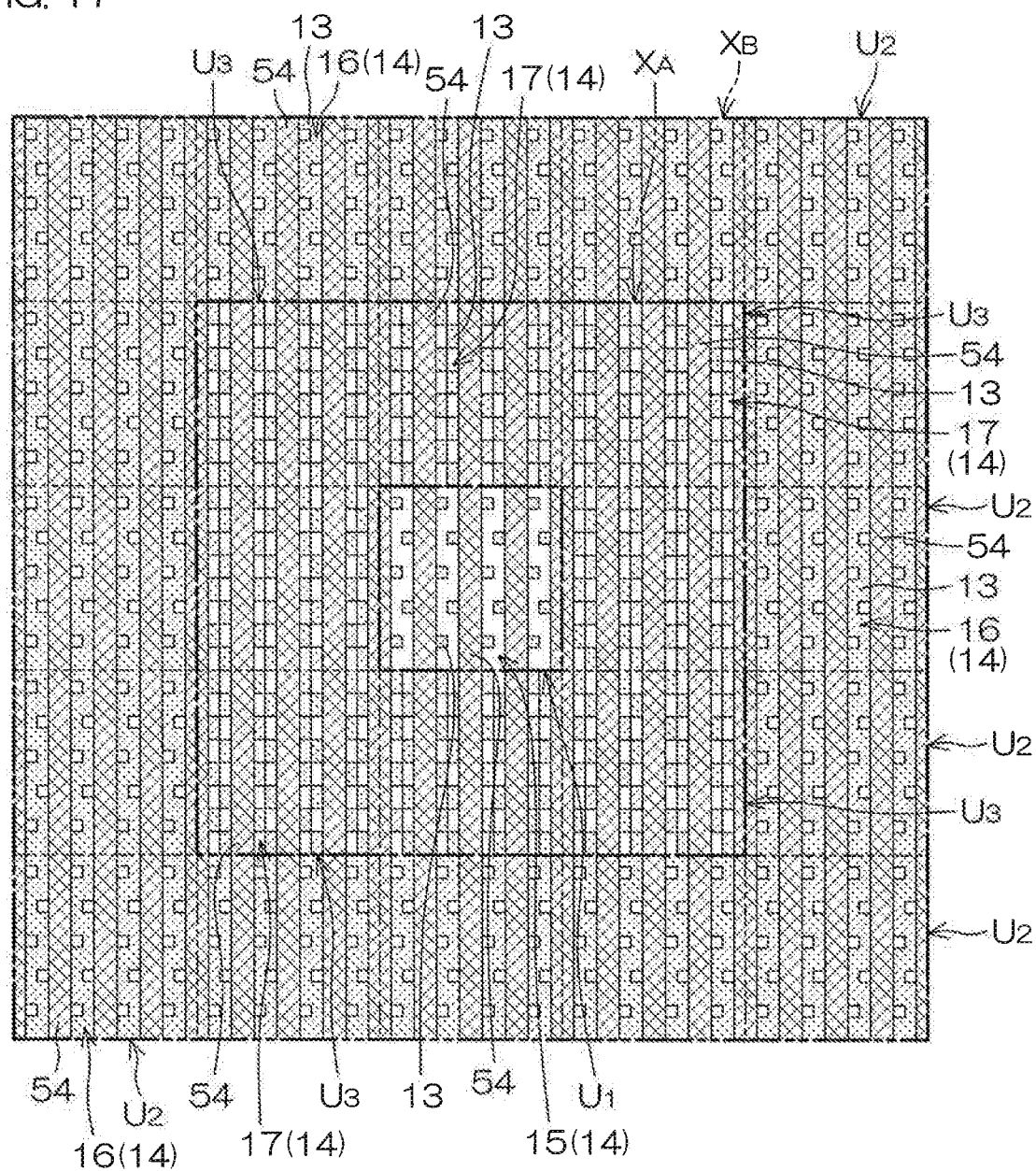
FIG. 17 is an enlarged plan view illustrating the active region, the enlarged plan view removing the structure on the substrate.

FIG. 17 is an enlarged plan view illustrating the active region 9 in FIG. 15B, the enlarged plan view removing the structure on the substrate 2.

With reference to FIG. 17, a plurality of trench gate structures 54 is linearly formed along the same direction on the surface of the substrate 2 in the active region 9. A functional element forming region 14 including a channel forming region 13 as a current path is formed between mutually adjacent trench gate structures 54 along each trench gate structure 54. A plurality of the functional element forming regions 14 is linearly arranged along each trench gate structure 54. As such, the trench gate structures 54 and the functional element forming regions 14 are alternately arranged in the horizontal direction intersecting with the trench gate structures 54.

In FIG. 17, for the sake of clarity, the trench gate structures 54 are shown in a dark cross hatching pattern, and the channel forming regions 13 are shown in a pale dot hatch pattern. Further, a region (hatching is not shown) outside the channel forming regions 13 between the gate structures 54 shows the surface of the substrate 2.

The feature of the semiconductor device 1 according to this embodiment, the plurality of functional element forming regions 14 includes a first functional element forming region 15 in which the area of the channel forming region 13 per unit area is relatively small, and a second functional element forming region 16 in which the area of the channel forming region 13 per unit area is relatively large, and the first functional element forming region 15 is provided at the region in which the generation of heat should be suppressed. This embodiment shows an example in which a third functional element forming region 17 is further provided between the first functional element forming region 15 and the second functional element forming region 16, the third functional element forming region 17 having the area of the channel forming region 13 per unit area that is larger than the first functional element forming region 15 and smaller than the second functional element forming region 16.

The area of the channel forming region 13 per unit area represents the area of the channel forming region 13 occupying a predetermined region between the trench gate structures 54. Further, the predetermined region represents a region with a predetermined area that is calculated by multiplying the width between the trench gate structures 54 by an arbitrary length along the length direction of the trench gate structures 54.

The first functional element forming region 15 has an area of the channel forming region 13 per unit area that is smaller than the second functional element forming region 16 and the third functional element forming region 17, and thus the amount of heat generation is also relatively small. Meanwhile, the on-resistance Ron of the first functional element forming region 15 is made larger than the second functional element forming region 16 and the third functional element forming region 17 with the channel forming region 13 having relatively small area.

In contrast, the second functional element forming region 16 and the third functional element forming region 17 has an area of the channel forming region 13 per unit area that is larger than the first functional element forming region 15, and thus the amount of heat generation is also relatively large. On the other hand, the on-resistance Ron of the second functional element forming region 16 and the third functional element forming region 17 is made smaller than the first functional element forming region 15 with the channel forming region 13 having relatively large area.

When comparing each amount of heat generation among the first to third functional element forming regions 15 to 17, the relations are represented by the following expression: the amount of heat generation in the first functional element forming region 15<the amount of heat generation in the third functional element forming region 17<the amount of heat generation in the second functional element forming region 16. When comparing each on-resistance $R_{on}$ among the first to third functional element forming regions 15 to 17, the relations are represented by the following expression: the on-resistance $R_{on}$ in the second functional element forming region 16<the on-resistance $R_{on}$ in the third functional element forming region 17<the on-resistance $R_{on}$ in the first functional element forming region 15. When comparing each dynamic clamping capability $E_{ac}$ among the first to third functional element forming regions 15 to 17, the relations are represented by the following expression: the dynamic clamping capability $E_{ac}$ in the second functional element forming region 16<the dynamic clamping capability $E_{ac}$ in the third functional element forming region 17<the dynamic clamping capability $E_{ac}$ in the first functional element forming region 15.

The semiconductor device 1 according to this embodiment, aims to provide the semiconductor device 1 capable of improving both the dynamic clamping capability $E_{ac}$ and the on-resistance $R_{on}$ while suppressing the temperature rise in the entire semiconductor device 1 by optimizing the layout of the first functional element forming region 15, the second functional element forming region 16, and the third functional element forming region 17. In the semiconductor device 1, the first functional element forming region 15 is assigned to the portions most likely subject to temperature rise, and the second functional element forming region 16 and the third functional element forming region 17 are assigned to the other portions, and thus the above-described purpose is securely achieved.

The regions that are subject to temperature rise, which therefore should be suppressed, includes, for example, an inner region spaced apart at a prescribed distance inwardly from the peripheral edge of the active region 9, a region surrounded by a plurality of channel forming regions 13 (a plurality of functional element forming regions 14), a region not overlapped with the end portion of the bonding wire 53 (connection portion between the bonding wire 53 and the source metal 10) in plan view, and a region in which these regions are selectively combined. In these regions, heat is likely to remain without being released. Specifically, the inner region of the active region 9 surrounded by the plurality of channel forming regions 13 (the plurality of functional element forming regions 14) is subject to temperature rise and is likely to have a temperature higher than the other portions.

Here, this embodiment is configured such that the first functional element forming region 15 is assigned to the central inner region of the active region 9, and the second functional element forming region 16 and the third functional element forming region 17 are assigned to the periphery thereof, and thus the area of the channel forming region 13 per unit area gradually increases from the central portion toward the peripheral portion in the active region 9. That is, the third functional element forming region 17 and the second functional element forming region 16 are formed in that order from the first functional element forming region 15 between the first functional element forming region 15 and the perimeter of the active region 9. Hereinafter, the layout of the plurality of functional element forming regions 14 is described in detail.

With reference to FIG. 17, the plurality of functional element forming regions 14 includes a unit U1 of first functional element forming regions including a plurality of (four in this embodiment) first functional element forming regions 15, a second unit U2 of functional element forming regions including a plurality of (four in this embodiment) second functional element forming regions 16, and a third unit U3 of functional element forming regions including a plurality of (four in this embodiment) third functional element forming regions 17.

The units U1 to U3 of first to third functional element forming regions according to this embodiment have a rectangular shape (square shape) in plan view with each having substantially the same area, and are arrayed in a matrix to cover the active region 9 with a predetermined layout. From another point of view, the units U1 to U3 of first to third functional element forming regions are arrayed with a predetermined layout in a plurality of square regions segmenting the active region 9 in a matrix.

The unit U1 of first functional element forming regions is assigned to the region in which the generation of heat should be suppressed, that is, the central portion of the active region 9 according to this embodiment. The third units U3 of functional element forming regions are arrayed in the periphery of the unit U1 of first functional element forming regions so as to surround the unit U1 of first functional element forming regions. A plurality of the third units U3 of functional element forming regions forms an annular (rectangular annular) region $X_A$ in plan view.

The second units U2 of functional element forming regions are arrayed in the periphery of the region $X_A$ so as to surround the region $X_A$. Thereby, a plurality of the second units U2 of functional element forming regions forms an annular (rectangular annular) region $X_B$ in plan view. In this way, this embodiment is configured such that the area of the channel forming region 13 per unit area gradually increases from the central portion of the active region 9 toward the peripheral edge thereof.

Figure 18A:
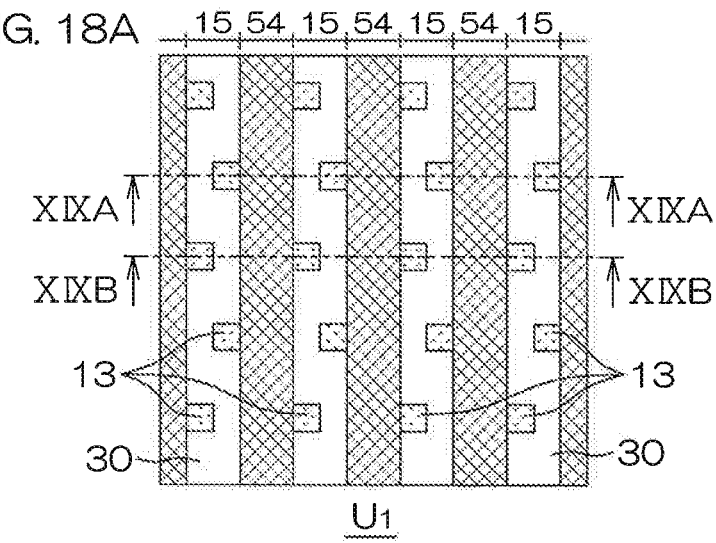
FIG. 18A is an enlarged plan view illustrating a first functional element forming region shown in FIG. 17.
Figure 18B:
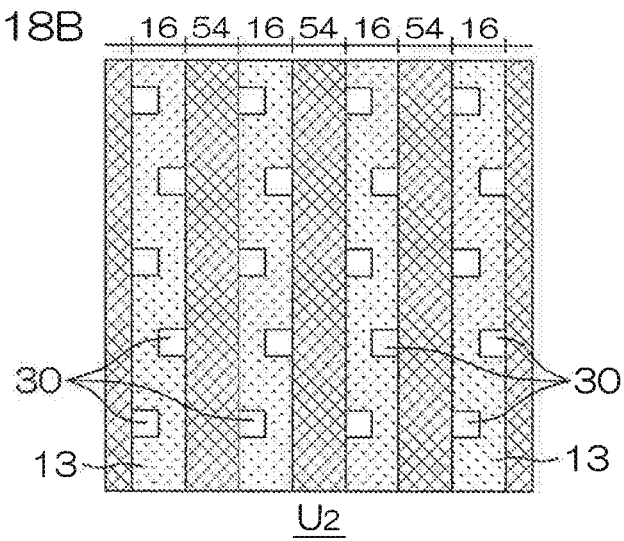
FIG. 18B is an enlarged plan view illustrating a second functional element forming region shown in FIG. 17.
Figure 18C:
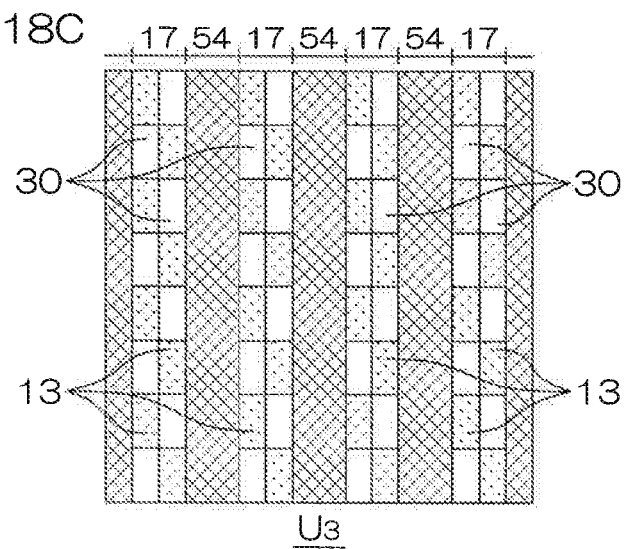
FIG. 18C is an enlarged plan view illustrating a third functional element forming region shown in FIG. 17.

Hereinafter, with reference to FIGS. 18A to 18C, description is made for the specific planar structure of the units U1 to U3 of first to third functional element forming regions. FIG. 18A is an enlarged plan view illustrating a first functional element forming region 15 (unit U1 of first functional element forming regions) shown in FIG. 17. FIG. 18B is an enlarged plan view illustrating a second functional element forming region 16 (unit U2 of second functional element forming regions) shown in FIG. 17. FIG. 18C is an enlarged plan view illustrating a third functional element forming region 17 (unit U3 of third functional element forming regions) shown in FIG. 17.

With reference to FIGS. 18A to 18C, the units U1 to U3 of first to third functional element forming regions are configured such that the area of the channel forming region 13 per unit area is adjusted to thereby change the layout of the first to third functional element forming regions 15 to 17. Hereinafter, description is made by defining the area ratio of the channel forming region 13 per unit area as 100% when the channel forming region 13 occupies the entire portion of the region between each trench gate structure 54 (that is, the functional element forming region 14).

With reference to FIG. 18A, the unit U1 of first functional element forming regions includes a plurality of first functional element forming regions 15 with the area ratio of the channel forming region 13 per unit area set to approximately 25%. With reference to FIG. 18B, the unit U2 of second functional element forming regions includes a plurality of second functional element forming regions 16 with the area ratio of the channel forming region 13 per unit area set to approximately 75%. With reference to FIG. 18C, the unit U3 of third functional element forming regions includes a plurality of third functional element forming regions 17 with the area ratio of the channel forming region 13 per unit area set to approximately 50%.

With reference to FIGS. 18A to 18C, the plurality of channel forming regions 13 is formed in the first to third functional element forming regions 15 to 17 with a layout based on a staggered arrangement or a zig-zag pattern.

With reference to FIG. 18A, in each first functional element forming region 15 of the unit U1 of first functional element forming regions, the plurality of channel forming regions 13 is arrayed in a staggered arrangement along the length direction of the trench structure 54. Referring to each trench structure 54, the plurality of channel forming regions 13 is arrayed alternately on one lateral surface and the other lateral surface of each trench structure 54 spaced apart from each other along the length direction of the trench structure 54. The plurality of channel forming regions 13 is placed at either one lateral surface or the other lateral surface along a horizontal direction intersecting with the trench gate structure 54.

With this configuration, in the unit U1 of first functional element forming regions, the area ratio of the channel forming region 13 is set to approximately 25%. In the unit U1 of first functional element forming regions, the channel forming region 13 is placed spaced apart from other channel forming regions 13 on one lateral surface or the other lateral surface of the trench gate structure 54, and thus the heat generation source can be effectively dispersed.

Further, the channel forming regions 13 placed on one lateral surface does not face the channel forming regions 13 placed on the other lateral surface across the trench gate structure 54. As such, a plurality of heat generation sources does not face each other across the trench gate structure 54 along the horizontal direction intersecting with the trench gate structure 54. With this configuration, the heat generated by one channel forming region 13 is prevented from transferring to other channel forming regions 13, and thus thermal interference can be effectively minimized. In this way, the unit U1 of first functional element forming regions is configured to effectively suppress temperature rise.

With reference to FIG. 18B, each second functional element forming region 16 in the unit U2 of second functional element forming regions is configured by extending the width of each channel forming region 13, which extends along the length direction of the trench gate structure 54 in the configuration shown in FIG. 18A, in the length direction of the trench gate structure 54. The channel forming regions 13 formed on one trench gate structure 54 along the horizontal direction intersecting with the trench gate structures 54 are integrally formed with the channel forming regions 13 formed on another trench gate structure 54. In this way, the channel forming regions 13 are formed in each second functional element forming region 16. With this configuration, the area ratio of the channel forming region 13 per unit area is set to approximately 75% in the unit U2 of second functional element forming regions.

With reference to FIG. 18C, each third functional element forming region 17 in the unit U3 of third functional element forming regions is configured by extending the width of each channel forming region 13, which extends along the length direction of the trench gate structure 54 in the configuration shown in FIG. 18A, in the length direction of the trench gate structure 54. With this configuration, the area ratio of the channel forming region 13 per unit area is set to approximately 50% in the unit U3 of third functional element forming regions.

According to this embodiment, description is made for an example in which the first to third functional element forming regions 15 to 17 with each having the area ratio of the channel forming region 13 per unit area of approximately 25%, 50%, and 75%. However, the area ratio of the channel forming region 13 per unit area may be changed between 0% and 100%, inclusive, in each functional element forming region 14 (each first to third functional element forming region 15 through 17). For example, a plurality of functional element forming areas 14 with the area ratio of the channel forming regions 13 mutually different between 0% and 100%, inclusive, may be included in a single unit of functional element forming regions.

<Cross-Sectional Structure of Functional Element Forming Region>

Figure 19A:
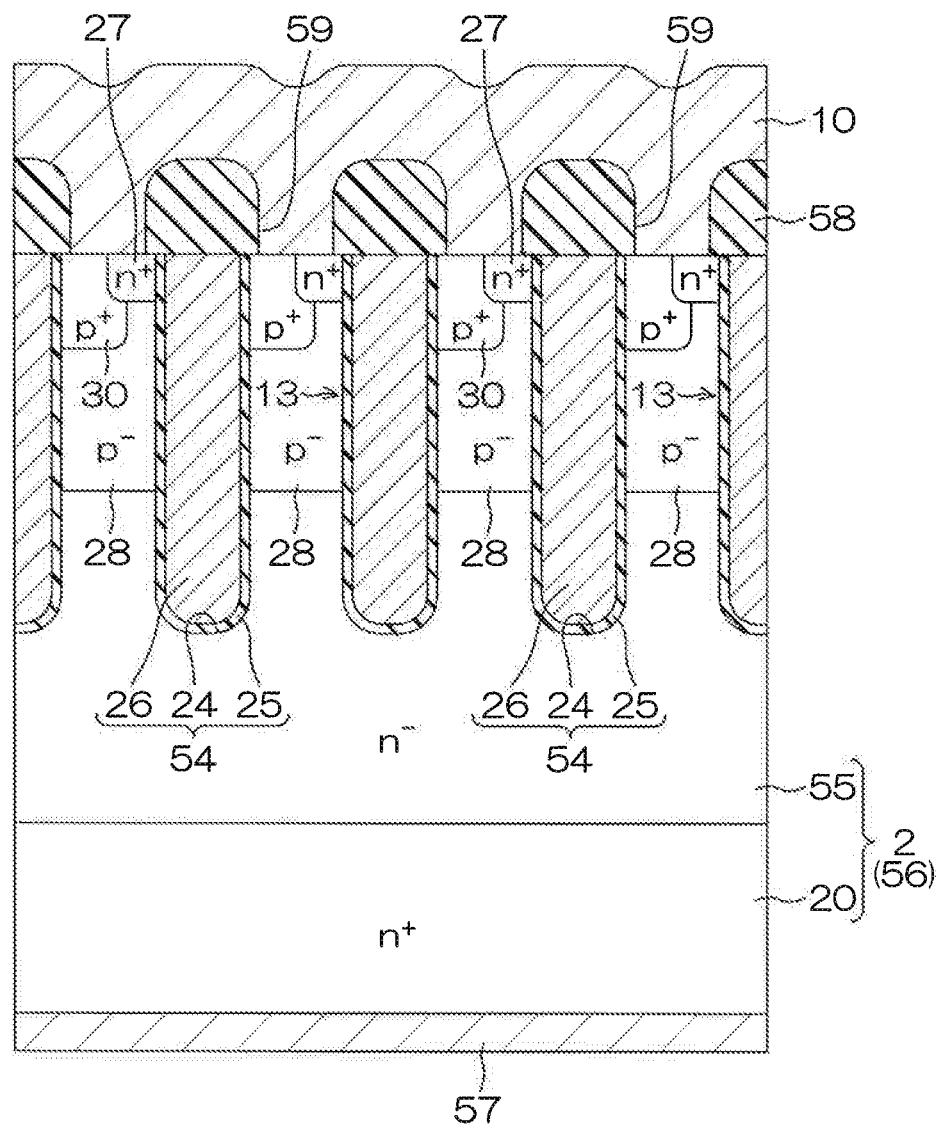
FIG. 19A is a vertical cross-sectional view along the line XIXA-XIXA shown in FIG. 18A.
Figure 19B:
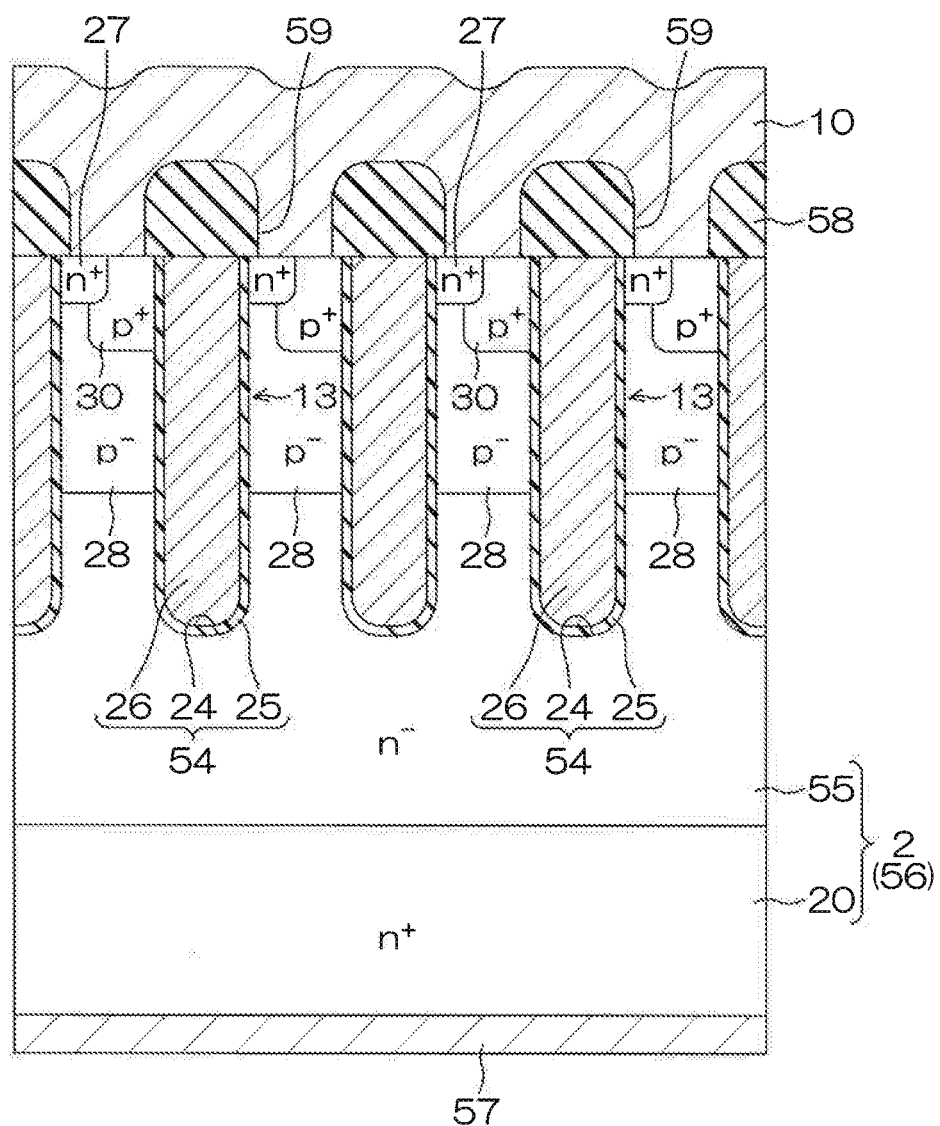
FIG. 19B is a vertical cross-sectional view along the line XIXB-XIXB shown in FIG. 18A.

Next, with reference to FIGS. 19A and 19B, description is made for the specific cross-sectional structure of the units U1 to U3 of first to third functional element forming regions. FIG. 19A is a vertical cross-sectional view along the line XIXA-XIXA shown in FIG. 18A. FIG. 19B is a vertical cross-sectional view along the line XIXB-XIXB shown in FIG. 18A. Apparently from FIGS. 18A to 18C, the unit U2 of second functional element forming regions and the unit U3 of third functional element forming regions have substantially the same cross-sectional structure as the unit U1 of first functional element forming regions, and thus the description is omitted.

With reference to FIGS. 19A and 19B, the previously described substrate 2 includes an $n^+$ type semiconductor substrate 20 and an $n^-$ type epitaxial layer 55 formed on the semiconductor substrate 20. A drain region 56 is composed of the semiconductor substrate 20 and the epitaxial layer 55. The surface of the substrate 2 is formed of the epitaxial layer 55 and the rear surface of the substrate 2 is formed of the semiconductor substrate 20.

The previously described source metal 10 is formed on the surface side of the substrate 2, and the drain metal 57 is formed on the rear surface side of the substrate 2. The drain metal 57 may correspond to the previously described the first electrode 112a. The previously described trench gate structures 54 are made in the surface part of the epitaxial layer 55, and includes the trench 24 dug through the epitaxial layer 55 and the gate electrode 26 embedded in the trench 24 with the gate insulating film 25 sandwiched therebetween.

FIGS. 19A and 19B shows an example in which the trench 24 is formed substantially orthogonal to the surface of the epitaxial layer 55. However, the trench 24 may have a taper-shape in cross-sectional view with the opening width gradually narrowed along the depth direction. Further, FIGS. 19A and 19B shows an example in which the bottom portion of the trench 24 is rounded outward from the lateral surface of the trench 24. However, the bottom portion of the trench 24 may be formed parallel to the surface of the epitaxial layer 55.

An $n^+$ type source region 27, a p type body region 28, and the drain region 56 (epitaxial layer 55) are provided on the lateral side (both lateral surface) of the trench gate structure 54 in that order from the surface of the substrate 2 along the depth direction. All the $n^+$ type source region 27, the $p^-$ type body region 28, and the drain region 56 are formed in contact with the trench gate structure 54, and face the gate electrode 26 with the gate insulating film 25 sandwiched therebetween.

The body region 28 is shared by one side trench gate structure 54 and the other side trench gate structure 54 between mutually adjacent trench gate structures 54. The source region 27 is formed exposed from the surface of the body region 28. The planar shape of the source region corresponds to the planar shape of the channel forming region 13. The body region 28 positioned on the lateral side of the trench gate structure 54 under the source region 27 constitutes the channel forming region 13. The formation of a channel in the channel forming region 13 is controlled by the trench gate structure 54 (gate electrode 26).

Accordingly, the previously described area of the channel forming region 13 is defined by the area of the region serving as a current path. More specifically, the area of the channel forming region 13 is defined by an opposing area in which the source region 27 faces the drain region 56 (epitaxial layer 55) with the body region 28 sandwiched therebetween in plan view.

Further, a $p^+$ body contact region 30 is formed such that the $p^+$ body contact region 30 is exposed from the surface of the body region 28 excluding the source region 27 between the plurality of trench gate structures 54 (see FIGS. 18A to 18C). The body contact region 30 is formed in contact with the lateral surface of the trench gate structure 54 and faces the gate electrode 26 with the gate insulating film 25 sandwiched therebetween. The bottom portion of the body contact region 30 is positioned in the region between the bottom portion of the body region 28 and the bottom portion of the source region 27.

FIGS. 19A and 19B show an example in which the end portion of the body contact region 30 not in contact with the trench gate structure 54 includes an overlap portion that selectively covers the source region 27. However, the body contact region 30 that does not include the overlap portion may be provided. Further, a structure not including the body contact region 30 may be adopted. In this case, the body region 28 is exposed from the surface of the epitaxial layer 55 excluding the source region 27.

A surface insulating film 58 is formed on the epitaxial layer 55 so as to cover the trench gate structure 54. The surface insulating film 58 has a contact hole 59 that selectively allows the source region 27 and the body contact region 30 to be exposed. The previously described source metal 10 extends into the contact hole 59 from above the surface insulating film 58 for electrical connection to the source region 27 and the body contact region 30 in the contact hole 59.

<Effects of Semiconductor Device>

Figure 20:
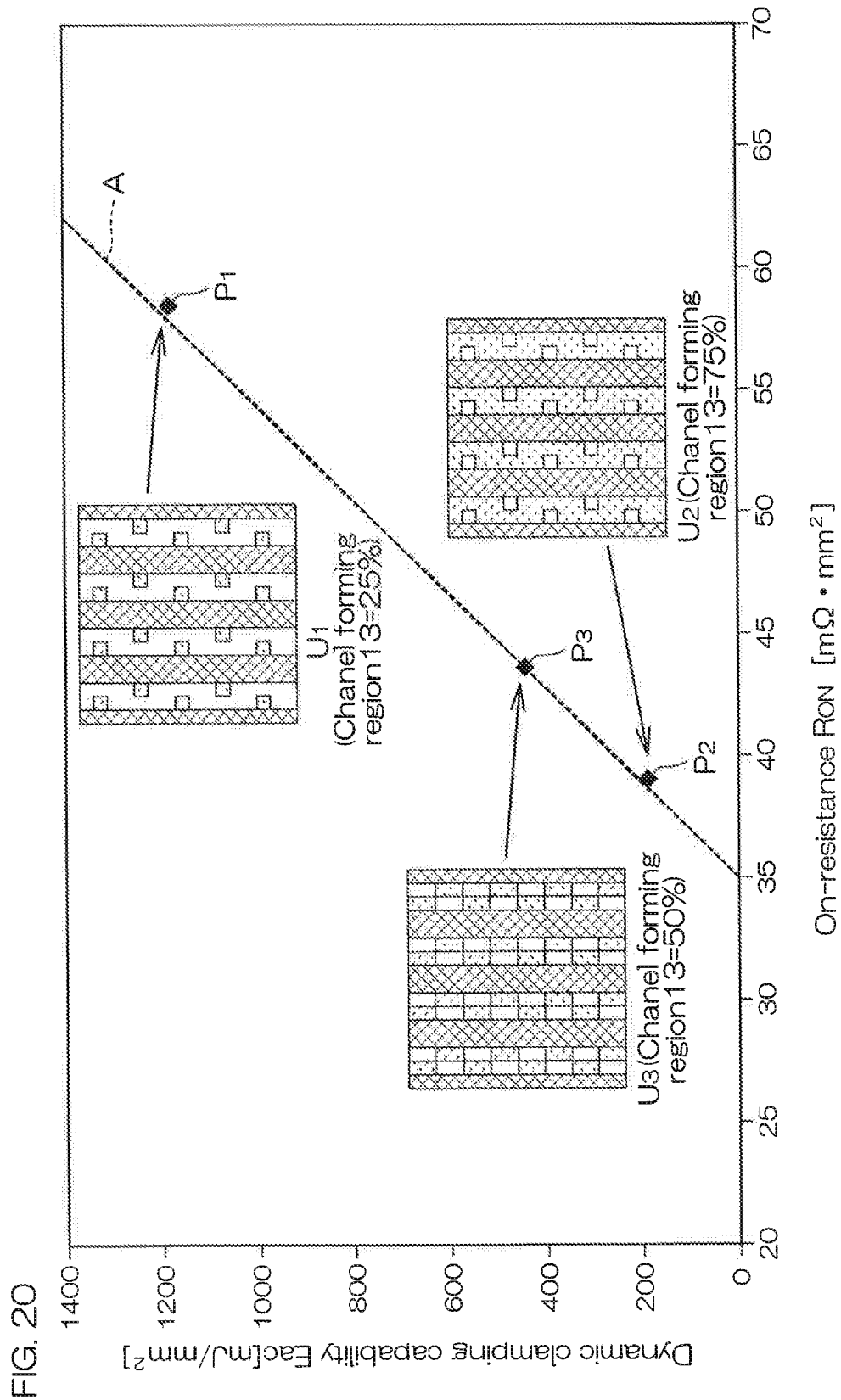
FIG. 20 is a graph illustrating characteristics of on-resistance-dynamic clamping capability.
Figure 21:
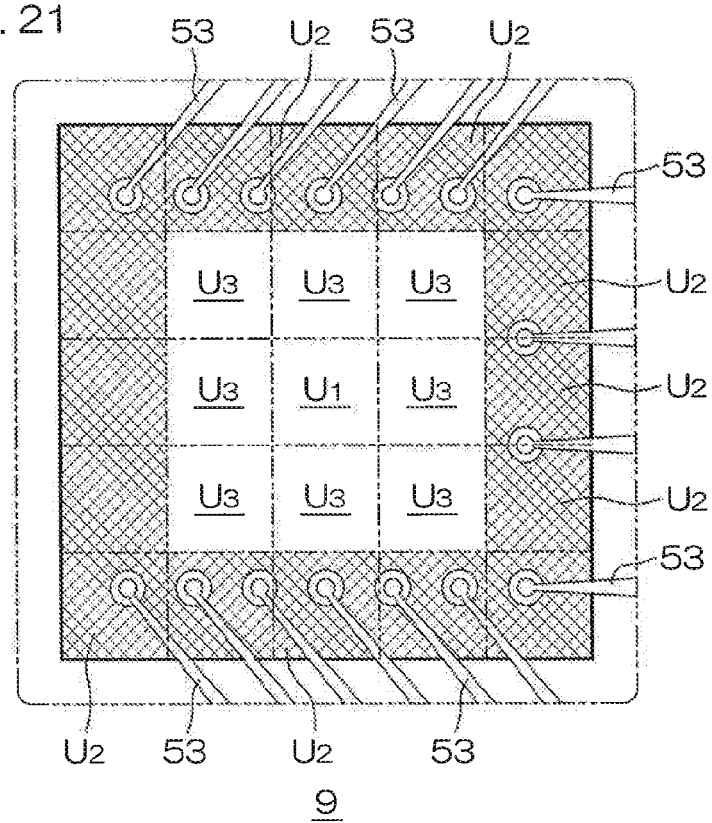
FIG. 21 is a plan view illustrating a positional relationship between a bonding wire and the functional element forming region.

Next, with reference to FIGS. 20 and 21, description is made about the effects of the semiconductor device 1. FIG. 20 is a graph illustrating characteristics of on-resistance $R_{on}$-dynamic clamping capability $E_{ac}$. In FIG. 20, the vertical axis represents the dynamic clamping capability $E_{ac}$ [mJ/mm$^2$], and the horizontal axis represents the on-resistance $R_{on}$ [mΩ·mm$^2$]. FIG. 20 shows a plot $P_1$, a plot $P_2$ and a plot $P_3$, and an approximate straight line A connecting these three plots $P_1$, $P_2$, and $P_3$.

The plot $P_1$ represents the characteristics of on-resistance $R_{on}$-dynamic clamping capability $E_{ac}$, when only the unit U1 of first functional element forming regions (area ratio of the channel forming region 13 is 25%) is arrayed in the active region 9 in matrix form.

The plot $P_2$ represents the characteristics of on-resistance $R_{on}$-dynamic clamping capability $E_{ac}$, when only the unit U2 of second functional element forming regions (area ratio of the channel forming region 13 is 75%) is arrayed in the active region 9 in matrix form.

The plot $P_3$ represents the characteristics of on-resistance $R_{on}$-dynamic clamping capability $E_{ac}$, when only the unit U3 of third functional element forming regions (area ratio of the channel forming region 13 is 50%) is arrayed in the active region 9 in matrix form.

It can be understood from the approximate straight line A that the area of the channel forming region 13 per unit area is inversely proportional to the on-resistance $R_{on}$. That is, when the area of the channel forming region 13 per unit area increases, the on-resistance $R_{on}$ decreases, and when the area of the channel forming region 13 per unit area decreases, the on-resistance $R_{on}$ increases.

Also, it can be understood from the approximate straight line A that the area of the channel forming region 13 per unit area is inversely proportional to the dynamic clamping capability $E_{ac}$. That is, when the area of the channel forming region 13 per unit area increases, the dynamic clamping capability $E_{ac}$ decreases, and when the area of the channel forming region 13 per unit area decreases, the dynamic clamping capability $E_{ac}$ increases.

With reference to plot $P_1$, when only the unit U1 of first functional element forming regions (area ratio of the channel forming region 13 is 25%) is arrayed in the active region 9 in matrix form, a relatively high and favorable dynamic clamping capability $E_{ac}$ can be achieved, however, the on-resistance $R_{on}$ becomes relatively high. On the other hand, with reference to plot $P_2$, when only the unit U2 of second functional element forming regions (area ratio of the channel forming region 13 is 75%) is arrayed in the active region 9 in matrix form, a relatively low and favorable on-resistance $R_{on}$ can be achieved, however, the dynamic clamping capability $E_{ac}$ becomes relatively low.

It can be understood from this that a trade-off relationship exists between the dynamic clamping capability $E_{ac}$ and the on-resistance $R_{on}$. As such, it can be understood that the values of the on-resistance $R_{on}$ and the dynamic clamping capability $E_{ac}$ can be set in the region deviated from the approximate straight line A by mixing various types of the functional element forming regions 14 with different areas of the channel forming region 13 per unit within a limited region (area), that is, a single active region 9.

For this reason, the unit U1 of first functional element forming regions configured to have a small amount of heat generation and a large dynamic clamping capability $E_{ac}$ is assigned to the region where heat generation should be suppressed, that is, the central portion of the active region 9. With this configuration, the temperature rise in the active region 9 can be effectively suppressed, while the central portion of the active region 9 can be prevented from becoming a high temperature transiently and locally. Also, the dynamic clamping capability $E_{ac}$ can be increased with the unit U1 of first functional element forming regions.

Meanwhile, the unit U2 of second functional element forming regions that has a larger area of the channel forming region 13 per unit area than the unit U1 of first functional element forming regions is assigned in the region other than the region where heat generation should be suppressed. As such, in the unit U2 of second functional element forming regions, a relatively large area can be secured for the current path with the channel forming area 13 having a relatively large area, and thus the current path can be prevented from decreasing as a whole when used along with the unit U1 of first functional element forming regions and so forth. Thereby, the increase in on-resistance can be suppresses by making use of the region other than the region where heat generation should be suppressed.

Further, according to this embodiment, the third functional element forming region 17 (unit U3 of third functional element forming regions) is assigned in the region between the first functional element forming region 15 (unit U1 of first functional element forming regions) and the second functional element forming region 16 (unit U2 of second functional element forming regions). The third functional element forming region 17 (unit U3 of third functional element forming regions) has characteristics of on-resistance $R_{on}$-dynamic clamping capability $E_{ac}$ between the first functional element forming region 15 (unit U1 of first functional element forming regions) and the second functional element forming region 16 (unit U2 of second functional element forming regions). With this configuration, the sudden fluctuations in characteristics between the unit U1 of first functional element forming regions and the unit U2 of second functional element forming regions can be suppressed, while the characteristics of on-resistance $R_{on}$-dynamic clamping capability $E_{ac}$ can be further preferably adjusted to desired characteristics.

FIG. 21 is a plan view illustrating a positional relationship between the bonding wire 53 and the unit U2 of second functional element forming regions. FIG. 21 is a schematic view of the previously described active region 9, and the unit U2 of second functional element forming regions is shown in a dark cross hatching pattern for the sake of explanation.

With reference to FIG. 21, the units U2 of second functional element forming regions are provided at regions overlapping the end portions of the bonding wire 53 (connection portion between the bonding portion 53 and the source metal 10) in plan view. The heat generated in the active region 9 is normally released to the outside through the source metal 10 as transmission passage. In contrast, the heat generated at the end portion of the bonding wire 53 or portions close thereto in the active region 9 can be released to the outside through the bonding wire 53 as transmission passage in addition to the source metal 10.

For this reason, the units U2 of second functional element forming regions having a relatively large amount of heat generation are provided at the regions overlapping the end portions of the bonding wires 53 in plan view, and thus the heat generated in the units U2 of second functional element forming regions can be released to the outside through the bonding wire 53 in addition to the source metal 10. Thereby, the temperature rise in the active region 9 (temperature rise in the substrate 2) can be effectively suppresses. Further, with this configuration, the increase in on-resistance $R_{on}$ can be favorably suppressed and the dynamic clamping capability $E_{ac}$ can be favorably increased.

With this configuration, the source metal preferably contains conductive materials having a relatively high thermal conductivity, for example, copper or aluminum. The source metal may be a plated copper film formed by plating. Similarly, the bonding wire 53 preferably contains conductive materials having a relatively high thermal conductivity, for example, copper or aluminum. Heat dissipation can be further improved by adopting the source metal 10 and the bonding wire 53 containing copper or aluminum.

Figure 22:
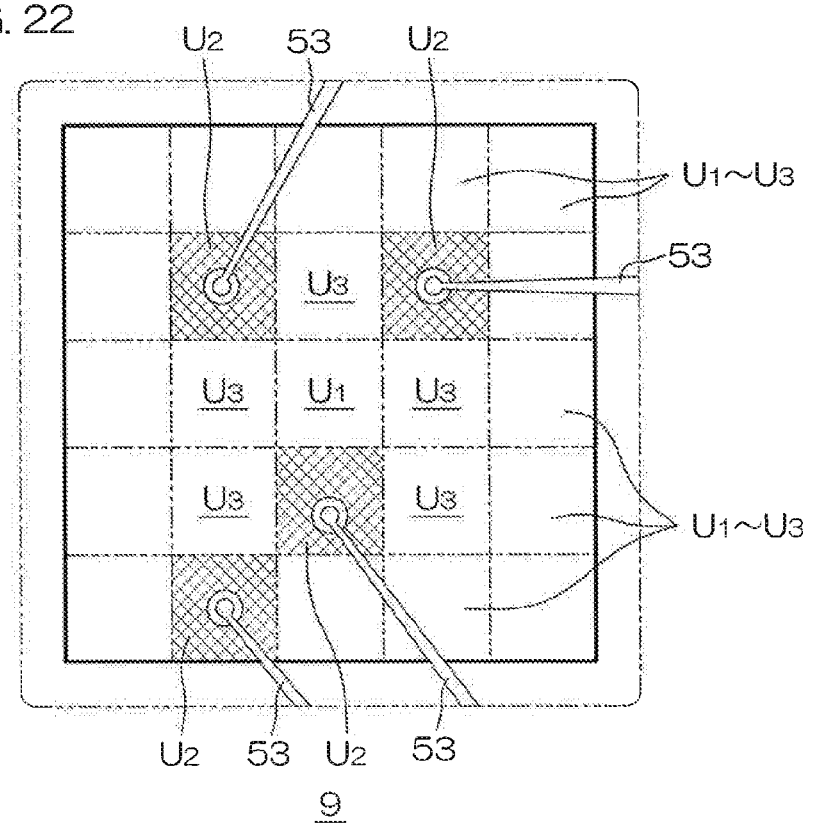
FIG. 22 is a plan view illustrating another positional relationship between the bonding wire and the functional element forming region.

According to this embodiment, description was made about an example in which the end portions of the bonding wire 53 are assigned to the peripheral edge portions of the active region 9 in plan view. However, as shown in FIG. 22, the end portions of the bonding wire 53 can be assigned to any portions in the active region 9 in plan view. In the case of such a configuration, the units U2 of second functional element forming regions may be assigned so as to match the positions of the end portions of the bonding wire 53. According to such a configuration, the unit U1 of first functional element forming regions and the unit U3 of third functional element forming regions may be selectively assigned to regions where heat generation should be suppressed and the peripheral region other than the regions for the units U2 of second functional element forming regions.

As described above, with the semiconductor device 1 according to this embodiment, it is possible to suppress temperature rise by optimizing the layout of the channel forming regions 13. Further, with the semiconductor device 1 according to this embodiment, it is possible to increase the dynamic clamping capability $E_{ac}$, while suppressing the increase in on-resistance $R_{on}$.

<Method for Manufacturing a Power MISFET>

Next, with reference to FIGS. 23A to 23G, description is made about an example of the method for manufacturing a power MISFET formed in the active region 9. FIGS. 23A to 23G are vertical cross-sectional views illustrating a step of the method for manufacturing the power MISFET. FIGS. 23A to 23G are vertical cross-sectional views of a portion corresponding to FIG. 19A.

Figure 23A:
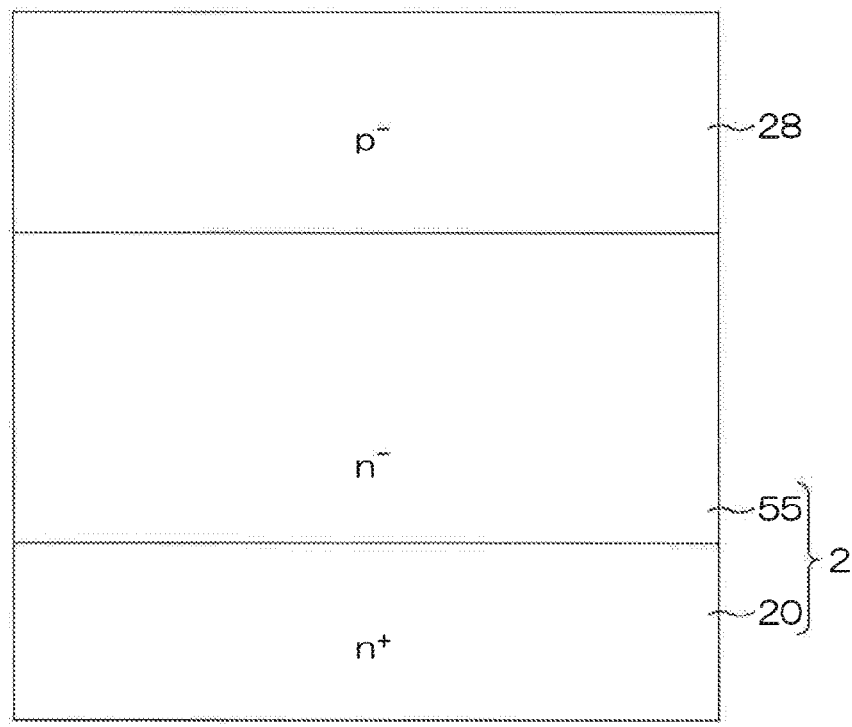

First, as shown in FIG. 23A, the substrate 2 including the semiconductor substrate 20 and the epitaxial layer 55 formed on the semiconductor substrate 20 is prepared. Next, an ion injection mask (not shown) selectively having openings at regions where the body regions 28 should be formed is formed on the substrate 2. Then, p-type impurities are injected into the surface part of the epitaxial layer 55 (substrate 2). Thereby, the body region 28 is formed in the surface part of the epitaxial layer 55. The ion injection mask is removed after the body region 28 is formed.

Figure 23B:
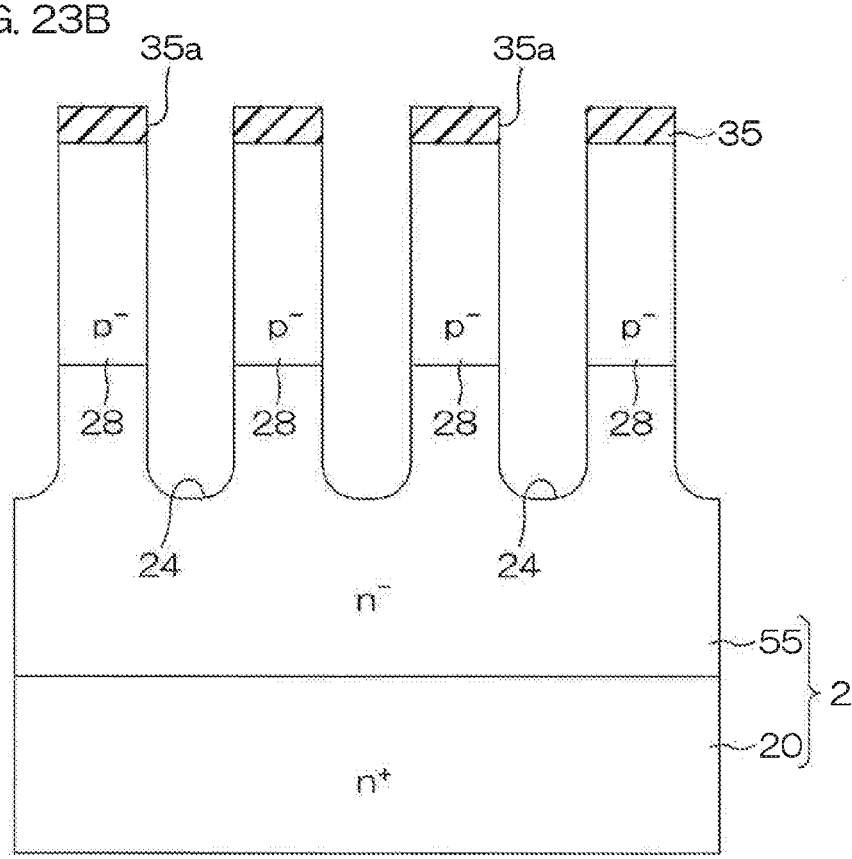

Next, as shown in FIG. 23B, a hard mask 35 selectively having openings 35a at regions where the trenches 24 should be formed is formed on the epitaxial layer 55. Then, the surface part of the epitaxial layer 55 is selectively removed by etching through the hard mask 35. Thereby, a plurality of trenches 24 is formed. The hard mask 35 is removed after the trenches 24 are formed.

Figure 23C:
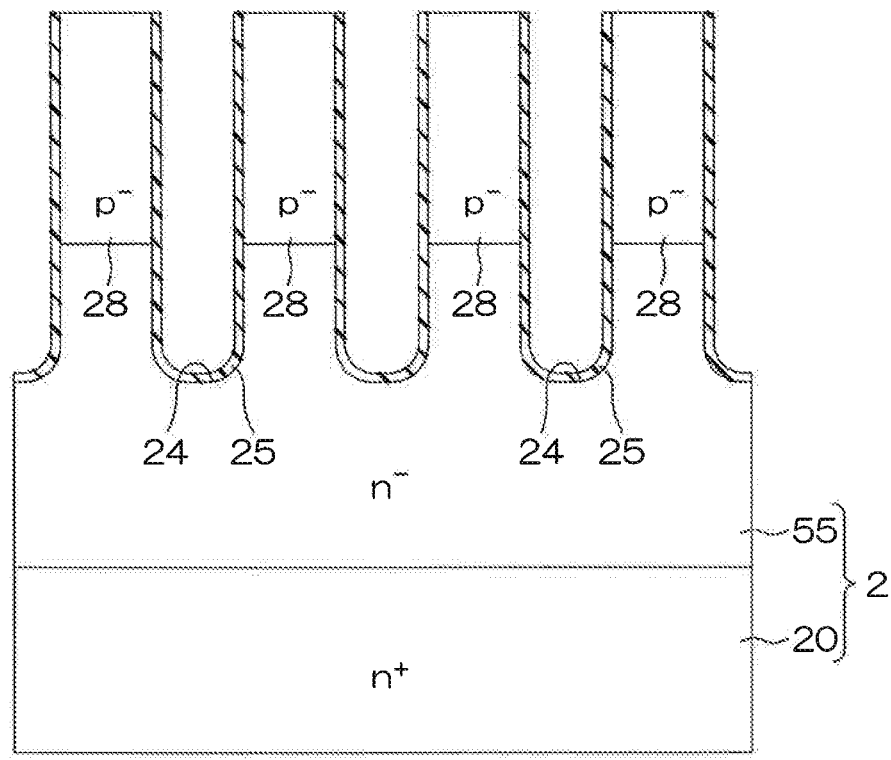

Next, as shown in FIG. 23C, the gate insulating film 25 made of oxide silicon is formed on the inner wall surface of the trenches 24 by, for example, the thermal oxidation method. The gate insulating film 25 may be also formed by laminating insulating materials on the inner wall surface of the trenches 24 by, for example, CVD method.

Figure 23D:
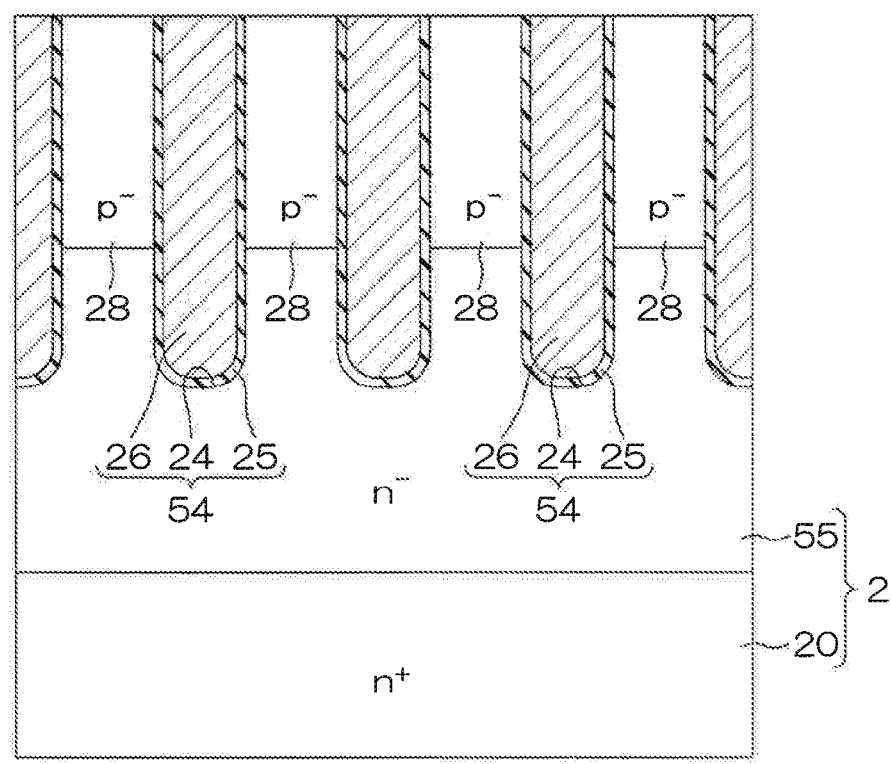

Next, as shown in FIG. 23D, an electrode material (for example, polysilicon) fills the trenches 24 and is laminated so as to cover the epitaxial layer 55. Thereafter, the laminated layers of the electrode material are selectively etched back, and the gate electrode 26 is formed in the trench 24. Thereby, the trench gate structure 54 is formed.

Figure 23E:
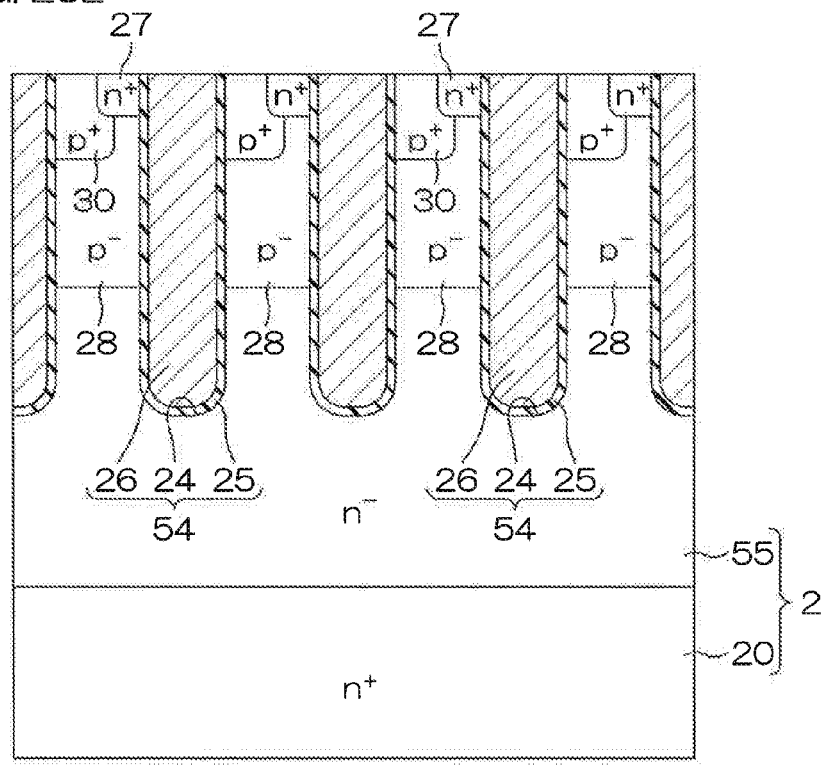

Next, as shown in FIG. 23E, the source region 27 and the body contact region 30 are formed in the surface part of the body region 28. The source region 27 is formed by the injection of n-type impurities through an ion injection mask selectively having openings at the regions where the source regions 27 should be formed. Thereby, the source regions 27 having relatively small area per unit area in plan view and the source regions having relatively large area per unit area in plan view are selectively formed. That is, through this process, the first functional element forming region 15 (unit U1 of first functional element forming regions), the second functional element forming region 16 (unit U2 of second functional element forming regions), and the third functional element forming region 17 (unit U3 of third functional element forming regions) are formed.

The body contact regions 30 are formed by the injection of p-type impurities through an ion injection mask selectively having openings at the regions where the body contact regions 30 should be formed.

Figure 23F:
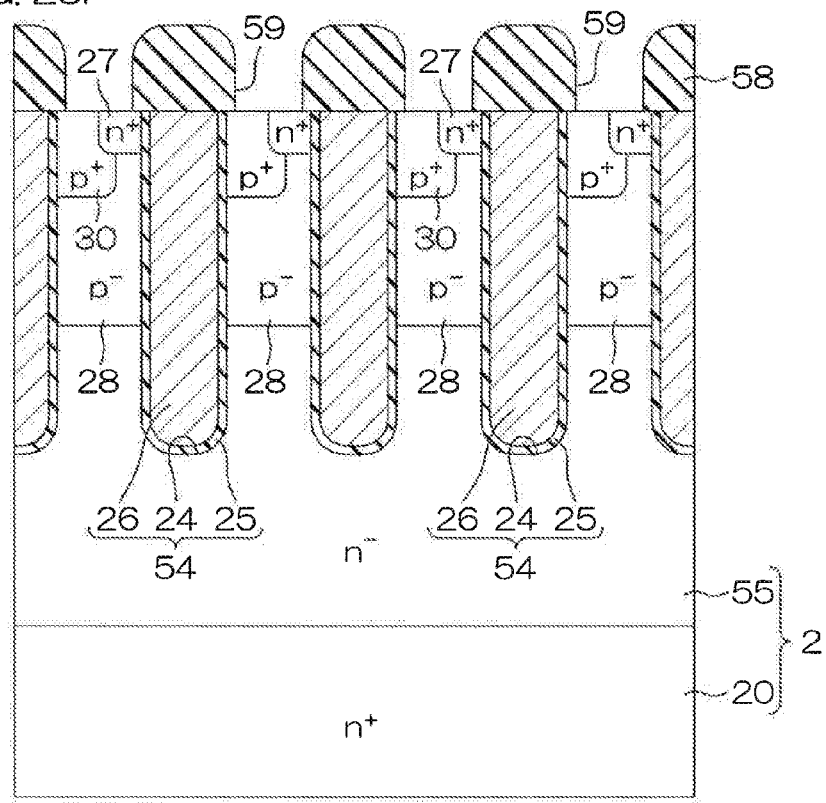

Next, as shown in FIG. 23F, an insulating material (silicon oxide in this embodiment) is laminated on the epitaxial layer 55 by, for example, CVD method. Thereby, the surface insulating film 58 is formed on the epitaxial layer 55. Next, the surface insulating film 58 is selectively etched and the contact holes 59 for selectively exposing the source region 27 and the body contact region 30 are formed in the surface insulating film 58.

Thereafter, as shown in FIG. 23G, a plated copper film as the source metal 10 is formed on the surface insulating film 58 by, for example, copper plating method. The source metal 10 may also be an aluminum film formed by sputtering. Further, an aluminum film as the drain metal 57 is formed on the rear surface of the substrate 2 by, for example, sputtering.

The drain metal 57 may be a plated copper film formed by, for example, copper plating method. Through the process described above, the power MISFET (switching circuit 3) is manufactured.

The current sensor circuit 48, the temperature sensor circuit 5, the overcharge current detection circuit 49, the thermal shut down circuit 7, and the under voltage lock out circuit 8 are all formed on the same substrate 2 in addition to the power MISFET (switching circuit 3). As such, part of the power MISFET (switching circuit 3) may be formed by making use of part of the process of forming the current sensor circuit 48, the temperature sensor circuit 5, the overcharge current detection circuit 49, the thermal shut down circuit 7, and the under voltage lock out circuit 8.

On the contrary, part of the current sensor circuit 48, the temperature sensor circuit 5, the overcharge current detection circuit 49, the thermal shut down circuit 7, and the under voltage lock out circuit 8 may be formed by making use of part of the process of forming the power MISFET (switching circuit 3). That is, the man-hours of the semiconductor device 1 can be reduced by performing a manufacturing process shared by part of the process of forming the current sensor circuit 48, the temperature sensor circuit 5, the overcharge current detection circuit 49, the thermal shut down circuit 7, and the under voltage lock out circuit 8, and part of the process of forming the power MISFET (switching circuit 3).

<Semiconductor Package>

The semiconductor device 1 may be incorporated in a semiconductor package 41 as shown in FIG. 24 other than the semiconductor packages shown in FIGS. 1 to 14. FIG. 24 is a plan view illustrating a semiconductor package 41 in which the semiconductor device 1 is incorporated, the semiconductor package 41 being shown partially notched.

As shown in FIG. 24, the semiconductor package 41 is a so-called transistor outline (TO) based resin package such as TO-220. The semiconductor package 41 includes the semiconductor device 1, a die pad 42 on which the semiconductor device 1 is placed, a plurality of leads 43 arranged in the periphery of the die pad 42, and a mold resin 44 sealing these components. The semiconductor device 1 is bonded to the die pad 42 via a conductive bonding material (solder).

The plurality of leads 43 includes three terminals 45, 46, 47. The three terminals 45, 46, 47 are arranged on one side of the die pad 42 spaced apart from each other. The center terminal 46 of the three terminals 45, 46, 47 is integrally formed with the die pad 42 at one end thereof. Both terminals 45, 47 of the three terminals 45, 46, 47 are arranged spaced apart from the die pad 42. Both terminals 45, 47 are selectively and electrically connected to the prescribed portions of the semiconductor device 1 through the bonding wire 53, respectively. Parts of the three terminals 45, 46, 47 are exposed from the mold resin 44 as external terminals connected to the outside.

According to FIG. 24, the other end portion 42a (the end portion opposite to the end portion where the leads 43 are arranged) of the die pad 42 is exposed from the mold resin 44, showing a structure equipped with the function of a heat radiator. However, a structure having the other end portion 42a of the die pad 42 covered with the mold resin 44 may be adopted.

The structure of the semiconductor package incorporating the semiconductor device 1 is not limited to the structure as shown in FIG. 24. As such, the semiconductor device 1 may be incorporated in well-known semiconductor packages such as a small outline package (SOP), a quad for non-lead package (QFN), a dual flat package (FFP), a dual inline package (DIP), a quad flat package (QFP), a single inline package (SIP), and a small outline J-leaded package (SOJ), and other various types of semiconductor packages similar to these packages.

Although the embodiments according to the present invention are described as above, it is possible to practice the present invention in other embodiments.

For example, the previously described embodiment describes an example of the unit U1 of first functional element forming regions assigned in the central portion of the active region 9 as the region where heat generation should be suppressed. However, involved in a layout in combination with the various types of circuits 48, 5, 49, 7 and 8 (see FIGS. 15A and 15B) provided in the periphery of the active region 9, a region generating a high temperature may exist in portions other than the central portion. In such a case, the first functional element forming region 15 (unit U1 of first functional element forming regions) may be assigned to the region generating a high temperature. Further, the portion of the bonding wire 53 (connection portion between the bonding wire 53 and the source metal 10) may be arranged so as to overlap the high temperature region in plan view.

Further, in the previously described embodiment, the unit U1 of first functional element forming regions may be provided so as to overlap the end portion of the bonding wire 53 (connection portion between the bonding wire 53 and the source metal 10) in plan view. According to this configuration, the temperature rise in the unit U1 of first functional element forming regions may be further suppressed.

Further, the previous embodiment describes an example where a plurality of linearly extending trench gate structures 54 is formed. However, the trench gate structures 54 may be arranged in a grid pattern in plan view by forming a plurality of trench gate structures 54 extending along a horizontal direction, intersecting with the trench gate structures 54, integrally with the plurality of the linearly extending trench gate structures 54.

Further, in the previous embodiment, a structure in which the conductivity type of each semiconductor portion is reversed may be adopted. That is, a p-type may be changed to an n-type, and vice versa.

Further in the previous embodiment, the substrate 2 may include a p-type semiconductor substrate 20 in place of the n-type semiconductor substrate 20. That is, a switching circuit 3 including an insulated gate bipolar transistor (IGBT) may be formed by forming the IGBT in the active region 9 in place of the MISFET. In this case, the drain region 56 and the drain metal 57 correspond to the collector region and the collector metal of the IGBT, and the source metal 10 and the source region 27 correspond to the emitter metal and the emitter region of the IGBT.

The semiconductor device 1 can be incorporated in a power module used in an inverter circuit for driving an electric motor that is used as a power source of, for example, an automobile (electric car included), a train, an industrial robot, an air conditioner, an air compressor, an electric fan, a vacuum cleaner, a dryer, and a refrigerator. Further the semiconductor device 1 can be incorporated in a power module used in an inverter circuit for a solar cell, a wind power generator, and other generators, and also can be incorporated in a circuit module composing an analog control power source, a digital control power source and so forth.

Various types of design changes can also be made without departing from the scope and spirit of the present invention.

Additionally, the subsequently described invention other than claimed inventions can also be extracted from the description of the specification and the drawings in relation to a second background art and a problem described below.

<Second Background Art>

The requested performance of a power semiconductor such as a power metal oxide semiconductor field effect transistor (power MOSFET) and an insulated gate bipolar transistor (IGBT) includes a lower loss due to a small on-resistance, higher switching characteristics in a high frequency region, a higher breakdown withstand voltage for the rise in a driving voltage and so forth.

Here, an inductive load such as a mechanical relay and solenoid coil is generally used in a vehicle electronic control unit (ECU) and a household appliance, which incorporate a power semiconductor. In this case, when the power semiconductor is switched on, a counter electromotive force is generated due to the inductance of an inductive load, and thus a reverse voltage is applied between the drain electrode and the source electrode of the power semiconductor (when the power semiconductor is a power MOSFET). When the reverse voltage reaches a certain value or more, an avalanche breakdown is generated. When the avalanche breakdown is generated in a power semiconductor, the power semiconductor generates heat, and may eventually be destroyed.

Therefore, although conventionally an active-clamp circuit using an avalanche diode or the like is additionally provided to prevent an avalanche breakdown in a power semiconductor device, the durability of a power semiconductor device against an avalanche breakdown, that is, the avalanche resistance of a power semiconductor device has been improved in recent years in order to reduce the number and the size of components.

For example, in a power semiconductor such as a power MOSFET having a plurality of trench gates formed therein, an avalanche resistance can be improved by securing a wider distance between mutually arranged trench gates. However, when a wider distance between trench gates is secured, the channel density decreases, to thereby increase an on-resistance.

Here, as shown in patent literature 2 (Japanese Unexamined Patent Application Publication 2015-149402), the dimensions (length and width) of each trench gate in a semiconductor element are individually established to thereby form a region where a lower channel density is established and a region where a higher channel density is established in a single semiconductor element, and thus a semiconductor device intended to improve the avalanche resistance while suppressing the rise of on-resistance is proposed. However, the semiconductor device creates a problem that the circuit design of the semiconductor elements is more complicated than ever before and the cost of the device increases.

<Second Problem>

In view of the above circumstances, the problem of the invention described below is to avoid complicatedness of the circuit design of a semiconductor element while suppressing the rise of on-resistance and to improve the avalanche resistance.

<Means for Solving Second Problem>

(Item 1) A semiconductor device comprising: a semiconductor element having a principal surface of the element and a rear surface of the element facing mutually opposite directions along the thickness direction, having a first electrode formed on the rear surface of the element and a second electrode and a third electrode formed on the principal surface of the element; a first lead including a first pad portion having the semiconductor element mounted thereon, electrically connected to the first electrode, and a first terminal portion extending along a first direction orthogonal to the thickness direction of the semiconductor element; a second lead electrically connected to the second electrode; a third lead electrically connected to the third electrode; a sealing resin covering each portion of the first lead, the second lead and the third lead, and the semiconductor element; and a first bonding wire for connecting the second electrode and the second lead, wherein a bonding portion is formed at the tip end of the first bonding wire to be in contact with the second electrode, and a plurality of heat releasing members is formed on the second electrode spaced apart from the bonding portion.

(Item 2) The semiconductor device according to item 1, wherein the shape of the heat releasing member is the same as that of the bonding portion.

(Item 3) The semiconductor device according to item 2, wherein both the first bonding wire and the heat releasing member are made of the same metal.

(Item 4) The semiconductor device according to item 3, wherein both the first bonding wire and the heat releasing member are made of Cu.

(Item 5) The semiconductor device according to any one of items 2 to 4, wherein the diameter of the heat releasing member is 60 to 100 μm.

(Item 6) The semiconductor device according to any one of items 2 to 4, wherein the height of the heat releasing member is 10 to 30 μm.

(Item 7) The semiconductor device according to any one of items 2 to 6, wherein the wire diameter of the first bonding wire is 30 to 70 μm.

(Item 8) The semiconductor device according to any one of items 1 to 7, wherein the bonding portion and the plurality of heat releasing members are arranged in a grid pattern on the second electrode.

(Item 9) The semiconductor device according to any one of items 1 to 8, wherein the first bonding wire is composed of a plurality of wires, and the second electrode and the second lead are connected through a plurality of first bonding wires.

(Item 10) The semiconductor device according to any one of items 1 to 9, wherein the area of the second electrode is larger than the area of the third electrode.

(Item 11) The semiconductor device according to item 10, wherein both the second electrode and the third electrode are constituted by a Cu layer and an Al layer mutually laminated.

(Item 12) The semiconductor device according to item 10 or 11, wherein a passivation film having electrical insulation properties and surrounding the second electrode and the third electrode is formed on the principal surface of the element.

(Item 13) The semiconductor device according to any one of items 1 to 12, wherein the semiconductor element is a power MOSFET or an IGBT.

(Item 14) The semiconductor device according to any one of items 1 to 13, wherein the semiconductor element is a thermosetting synthetic resin having electrical insulation properties.

(Item 15) The semiconductor device according to items 14, wherein the sealing resin is an epoxy resin.

(Item 16) The semiconductor device according to any one of items 1 to 15, wherein the sealing resin has a principal surface of the resin and a rear surface of the resin facing mutually opposite directions along the thickness direction of the semiconductor element, and part of the first pad portion is exposed from the rear surface of the resin.

(Item 17) The semiconductor device according to item 16, wherein both the second lead and the third lead extend along the first direction, and the first terminal portion is positioned between the second lead and the third lead along a direction orthogonal to both the thickness direction of the semiconductor element and the first direction.

(Item 18) The semiconductor device according to item 17, wherein a body through-hole is formed from the principal surface of the resin to the first pad portion along the thickness direction of the semiconductor element, and the hole wall of the body through-hole is formed of the sealing resin.

(Item 19) The semiconductor device according to item 16, wherein the second lead and the third lead extend along a second direction opposite the first direction, and each portion of the first terminal portion, the second lead and the third lead is exposed from the rear surface of the resin.

(Item 20) The semiconductor device according to any one of items 1 to 19, wherein all the first lead, the second lead and the third lead are made of a Cu-based alloy.

(Item 21) The semiconductor device according to any one of items 1 to 20, wherein an externally plated layer covering each portion of the first lead, the second lead and the third lead exposed from the sealing resin is provided.

(Item 22) The semiconductor device according to item 21, wherein the externally plated layer is made of an Sn-based alloy.

(Item 23) The semiconductor device according to any one of items 1 to 22, wherein an internally plated layer formed on each portion of the first lead, the second lead and the third lead covered with the sealing resin is provided.

(Item 24) The semiconductor device according to item 23, wherein the internally plated layer is made of Ag.

<Effects Created by Means for Solving Second Problem>

The semiconductor device includes the semiconductor element having the first electrode formed on the rear surface of the resin, and the first bonding wire that connects the second electrode and the second lead, and the bonding portion is formed at the tip end of the first bonding wire to be in contact with the second electrode. Further, the plurality of heat releasing members is formed on the second electrode spaced apart from the bonding portion. In this case, when the semiconductor element is switched on, a reverse voltage is applied between the first electrode and the second electrode due to the inductance of the inductive load, and thus heat is generated in the second electrode. At this time, the heat generated in the second electrode is released to the periphery of the semiconductor element by the plurality of heat releasing members, and thus the temperature rise in the semiconductor element is suppressed. Therefore, with the plurality of heat releasing members, avalanche breakdown can be avoided without changing the dimensions of the trench gate in the semiconductor element, and as a result, the avalanche resistance of the semiconductor element is improved. Therefore, according to the semiconductor device described above, it is possible to suppress the rise of on-resistance while avoiding complicatedness of the circuit design of a semiconductor element, and improve the avalanche resistance.

What is claimed is:
1. A semiconductor device comprising:
a substrate;
a plurality of trenches formed in the substrate; and a plurality of functional element forming regions arrayed along each of the trenches, including a channel forming region as a current path, wherein the plurality of functional element forming regions includes a first functional element forming region in which an area of the channel forming region per unit area is relatively small and a second functional element forming region in which the area of the channel forming region per unit area is relatively large, and the first functional element forming region is provided at a region where heat generation should be suppressed.

2. The semiconductor device according to claim 1, wherein the plurality of functional element forming regions includes a group of first functional element forming regions including a plurality of the first functional element forming regions and a group of second functional element forming regions including a plurality of the second functional element forming regions, and the group of first functional element forming regions is provided at the region where heat generation should be suppressed.

3. The semiconductor device according to claim 2, wherein the group of first functional element forming regions and the group of second functional element forming regions are arrayed in a matrix.

4. The semiconductor device according to claim 1, wherein the plurality of trenches is linearly formed in the substrate along the same direction, and each of the functional element forming regions is formed between adjacent trenches along a length direction of the trenches.

5. The semiconductor device according to claim 1, further comprising:

a gate electrode embedded in one of the trenches through an insulating film; and a source region, the channel forming region, and a drain region formed in that order from a front surface to a rear surface of the substrate in a surface part of the substrate positioned on a lateral side of each trench in each of the functional element forming regions.

6. The semiconductor device according to claim 5, wherein the first functional element forming region includes the source region having a relatively small area per unit area in plan view, and the second functional element forming region includes the source region having a relatively large area per unit area in plan view.

7. The semiconductor device according to claim 1, further comprising: a conductive line electrically connected to the plurality of functional element forming regions, wherein the second functional element forming region is provided at a region overlapping the conductive line in plan view.

8. The semiconductor device according to claim 1, wherein the semiconductor device has a principal surface of an element and a rear surface of a element facing mutually opposite directions along a thickness direction with the plurality of functional element forming regions formed on the principal surface of the element, the semiconductor device further comprising:

a first electrode formed on the rear surface of the element; and a second electrode and a third electrode formed on the principal surface of the element.

9. A semiconductor package comprising:

the semiconductor device according to claim 8;

a first lead including a first pad portion having the semiconductor device mounted thereon and is electrically connected to the first electrode, and a first terminal portion extending along a first direction orthogonal to the thickness direction of the semiconductor device;

a second lead electrically connected to the second electrode;

a third lead electrically connected to the third electrode;

a sealing resin covering each portion of the first lead, the second lead and the third lead, and the semiconductor device; and a first bonding wire for connecting the second electrode and the second lead, wherein a bonding portion is formed at a tip end of the first bonding wire to be in contact with the second electrode, and a plurality of heat releasing members is formed on the second electrode spaced apart from the bonding portion.

10. The semiconductor package according to claim 9, wherein a shape of the heat releasing members is the same as a shape of the bonding portion.

11. The semiconductor package according to claim 10, wherein both the first bonding wire and the heat releasing members are made of a same metal.

12. The semiconductor package according to claim 11, wherein both the first bonding wire and the heat releasing members are made of Cu.

13. The semiconductor package according to claim 10, wherein a diameter of the heat releasing members is 60 to 100 µm.

14. The semiconductor package according to claim 10, wherein a height of the heat releasing members is 10 to 30 µm.

15. The semiconductor package according to claim 10, wherein a wire diameter of the first bonding wire is 30 to 70 µm.

16. The semiconductor package according to claim 9, wherein the bonding portion and the plurality of heat releasing members are arrayed in a grid pattern on the second electrode.

17. The semiconductor package according to claim 9, wherein the first bonding wire is composed of a plurality of wires, and the second electrode and the second lead are connected through a plurality of the boding wires.

18. The semiconductor package according to claim 9, wherein an area of the second electrode is larger than an area of the third electrode.

19. A semiconductor device comprising:

a substrate;

a plurality of trenches formed in the substrate;

a plurality of functional element forming regions arrayed along each of the trenches, including a channel forming region as a current path, and a conductive line electrically connected to the plurality of functional element forming regions, wherein the plurality of functional element forming regions includes a first functional element forming region in which an area of the channel forming region per unit area is relatively small and a second functional element forming region in which an area of the channel forming region per unit area is relatively large, and the second functional element forming region is provided at a region overlapping the conductive line in plan view.

20. The semiconductor device according to claim 19, wherein the plurality of functional element forming regions includes a group of first functional element forming regions including a plurality of the first functional element forming regions and a group of second functional element forming regions including a plurality of the second functional element forming regions, and the group of second functional element forming regions is provided at a region overlapping the conductive line in plan view.

* * * * *